United States Patent
Wu et al.

(10) Patent No.: US 10,510,767 B1
(45) Date of Patent: Dec. 17, 2019

(54) INTEGRATED CIRCUIT AND METHOD FOR MANUFACTURING THE SAME

(71) Applicant: Taiwan Semiconductor Manufacturing Co., Ltd., Hsin-Chu (TW)

(72) Inventors: Yun-Chi Wu, Tainan (TW); Cheng-Bo Shu, Tainan (TW); Chien Hung Liu, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/562,850

(22) Filed: Sep. 6, 2019

Related U.S. Application Data

(62) Division of application No. 15/935,277, filed on Mar. 26, 2018.

(Continued)

(51) Int. Cl.
*H01L 29/00* (2006.01)
*H01L 27/1157* (2017.01)
(Continued)

(52) U.S. Cl.
CPC .... *H01L 27/1157* (2013.01); *H01L 27/11573* (2013.01); *H01L 29/0847* (2013.01);
(Continued)

(58) Field of Classification Search
None
See application file for complete search history.

(56) References Cited

U.S. PATENT DOCUMENTS 6,590,244 B2   7/2003   Asao et al.
6,953,719 B2   10/2005  Doczy et al.
(Continued)

FOREIGN PATENT DOCUMENTS

TW   200830539 A   7/2008

OTHER PUBLICATIONS

Jeon, et al. "Impact of Metal Work Function on Memory Properties of Charge-Trap Flash Memory Devices Using Fowler-Nordheim P/E Mode." IEEE Electron Device Letters, vol. 27, No. 6, Jun. 2006.
(Continued)

*Primary Examiner* — Ajay Arora
(74) *Attorney, Agent, or Firm* — Eschweiler & Potashnik, LLC

(57) ABSTRACT

Various embodiments of the present application are directed to an integrated circuit (IC) comprising a memory cell with a large operation window and a high erase speed. In some embodiments, the IC comprises a semiconductor substrate and a memory cell. The memory cell comprises a control gate electrode, a select gate electrode, a charge trapping layer, and a common source/drain region. The common source/drain is defined by the semiconductor substrate and is n-type. The control gate electrode and the select gate electrode overlie the semiconductor substrate and are respectively on opposite sides of the common source/drain. Further, the control gate electrode overlies the charge trapping layer and comprises a metal with a p-type work function. In some embodiments, the select gate electrode comprises a metal with an n-type work function.

20 Claims, 24 Drawing Sheets

Related U.S. Application Data

(60) Provisional application No. 62/552,149, filed on Aug. 30, 2017.

(51) Int. Cl.
| | | |
|---|---|---|
| *H01L 21/28* | (2006.01) | |
| *H01L 29/49* | (2006.01) | |
| *H01L 29/66* | (2006.01) | |
| *H01L 29/792* | (2006.01) | |
| *H01L 27/11573* | (2017.01) | |
| *H01L 29/08* | (2006.01) | |

(52) U.S. Cl.
CPC ...... *H01L 29/40117* (2019.08); *H01L 29/495* (2013.01); *H01L 29/4916* (2013.01); *H01L 29/66545* (2013.01); *H01L 29/66833* (2013.01); *H01L 29/792* (2013.01)

(56) References Cited

U.S. PATENT DOCUMENTS

| | | | |
|---|---|---|---|
| 8,883,624 B1 | 11/2014 | Ramkumar | |
| 2006/0261398 A1 | 11/2006 | Lee | |
| 2008/0106934 A1* | 5/2008 | Lee | ........................ H01L 27/115 365/185.01 |
| 2009/0239351 A1 | 9/2009 | Aloni et al. | |
| 2015/0103603 A1 | 4/2015 | Chang et al. | |
| 2017/0194333 A1 | 7/2017 | Wu et al. | |

OTHER PUBLICATIONS

Lai, et al. "An Oxide-Buffered BE-MANOS Charge-Trapping Device and the Role of Al2O3." IEEE Non-Volatile Semiconductor Memory Workshop, 2008 and 2008 International Conference on Memory Technology and Design. NVSMW/ICMTD 2008. Published May 30, 2008.

Gadamsetti, Balapradeep. "Intel's Low Power Technology With High-K Dielectric." Published Oct. 16, 2002. Retrieved online on Aug. 28, 2017 from www.eng.auburn.edu%2F~agrawvd%2FCOURSE%2FE6200_Fall08%2FCLASS_TALKS%2FIntel's%2520Innovative%2520Technology.ppt&usg=AOvVaw3BWxEfEZ6KtTwDDeajfUlm.

Cheung, N. "Electrical Characteristics of MOS Devices." University of Berkeley, course EE143, published fall of 2010.

"Work Function Tuning for Metal Gate Transistors." Published Apr. 30, 2009. Retrieved on Aug. 28, 2017 from http://electrons.wikidot.com/dharma.

Wikipedia.org "Work Function." Published on Aug. 24, 2017. Retrieved online on Aug. 28, 2017 from https://en.wikipedia.org/wiki/Work_function.

Non-Final Office Action dated Aug. 8, 2019 for U.S. Application number Aug. 8, 2019.

* cited by examiner

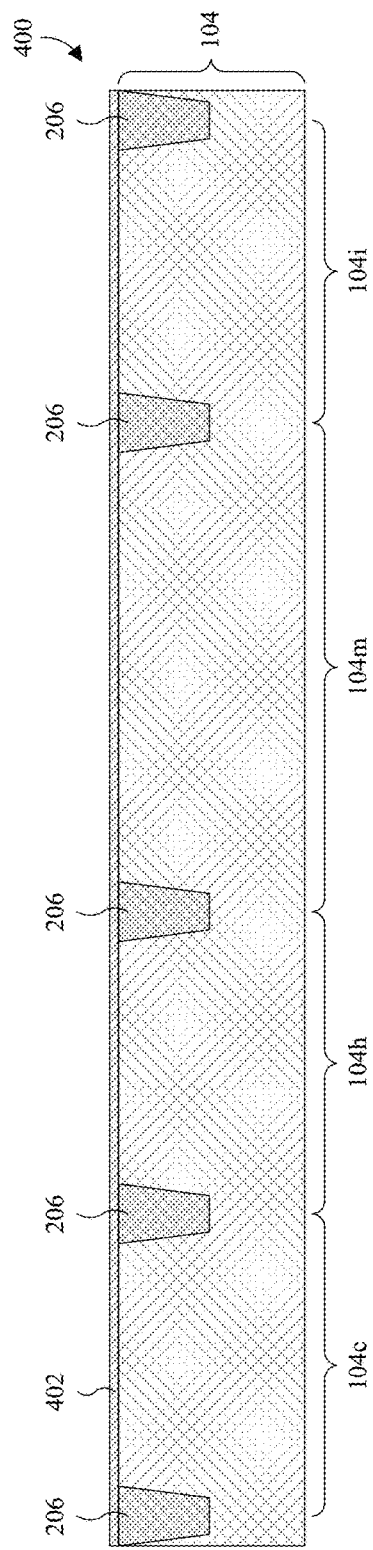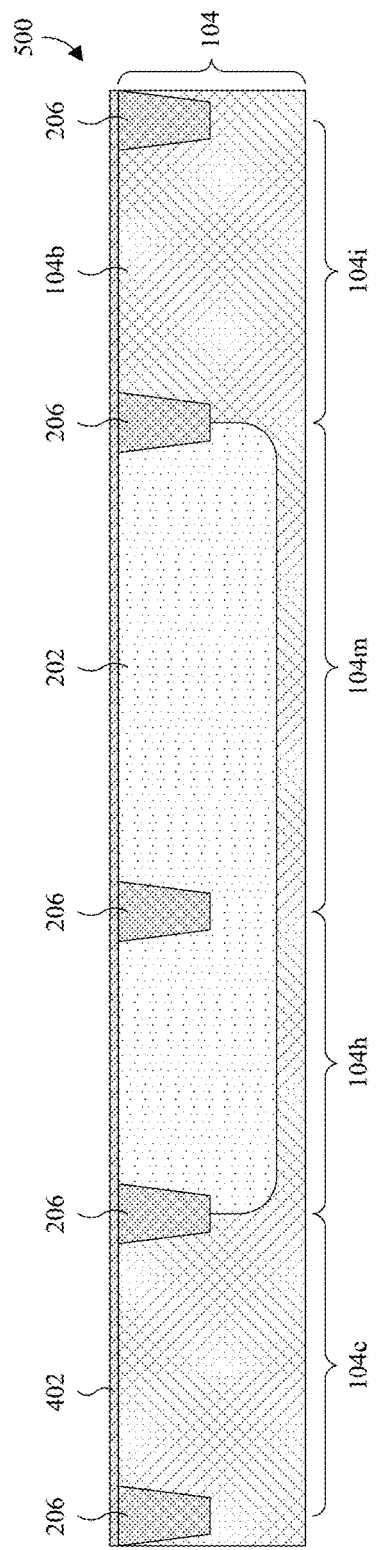

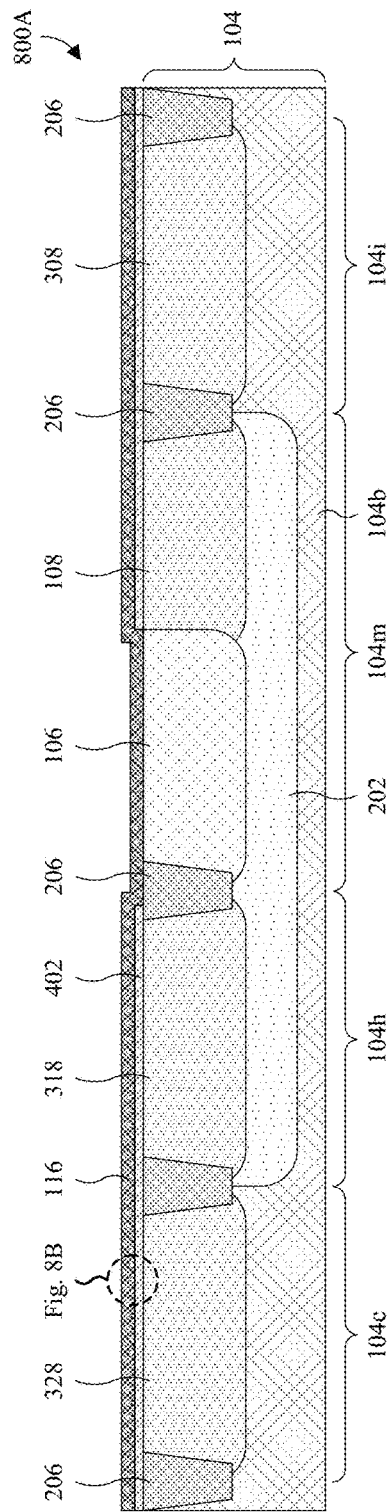
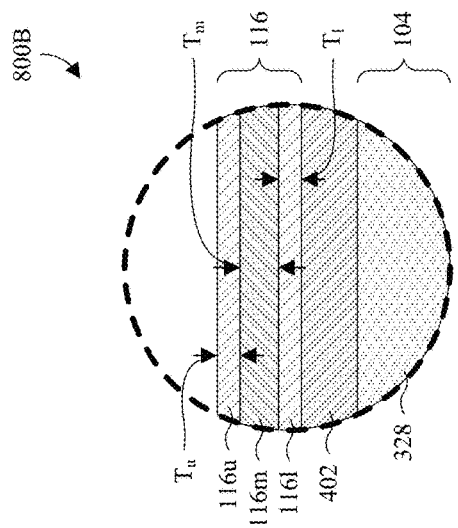
Fig. 8A
Fig. 8B

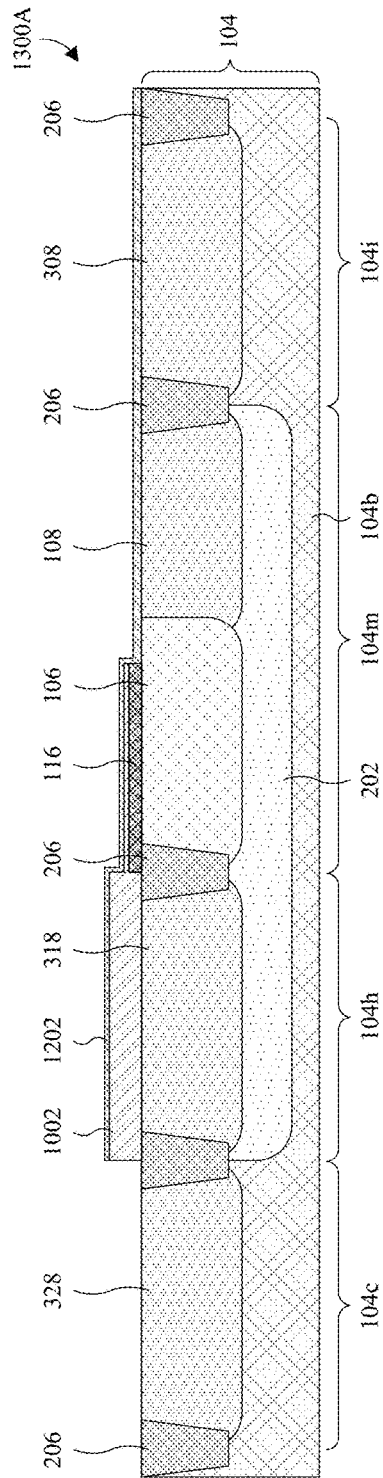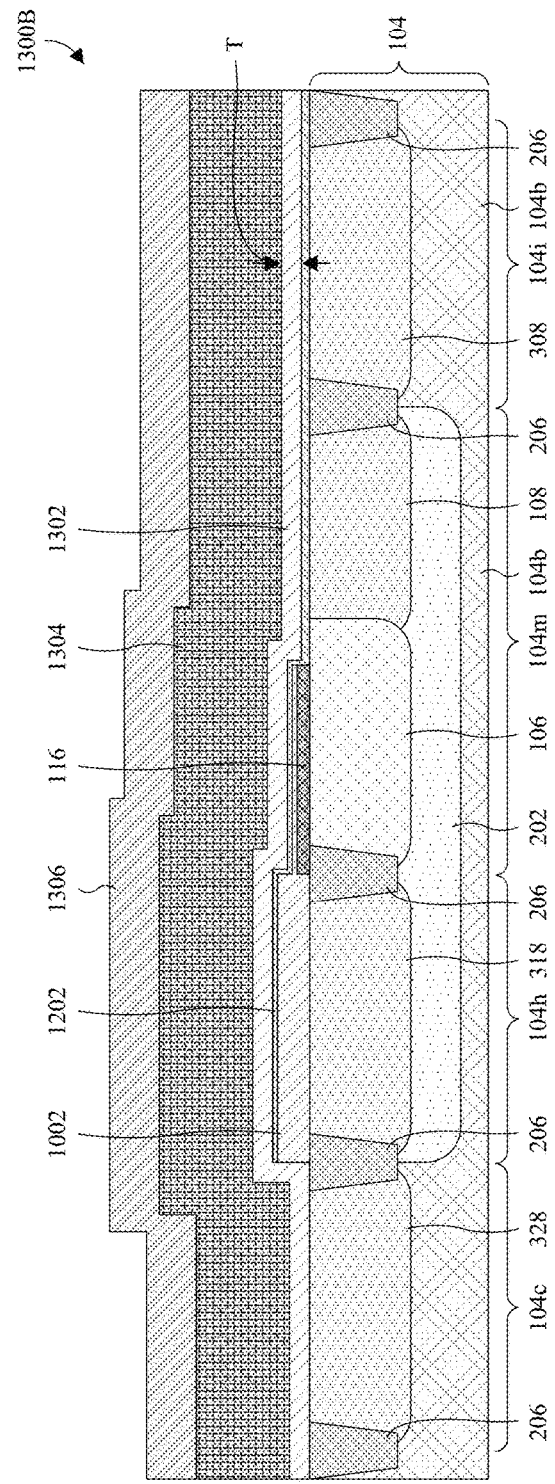
Fig. 13A
Fig. 13B

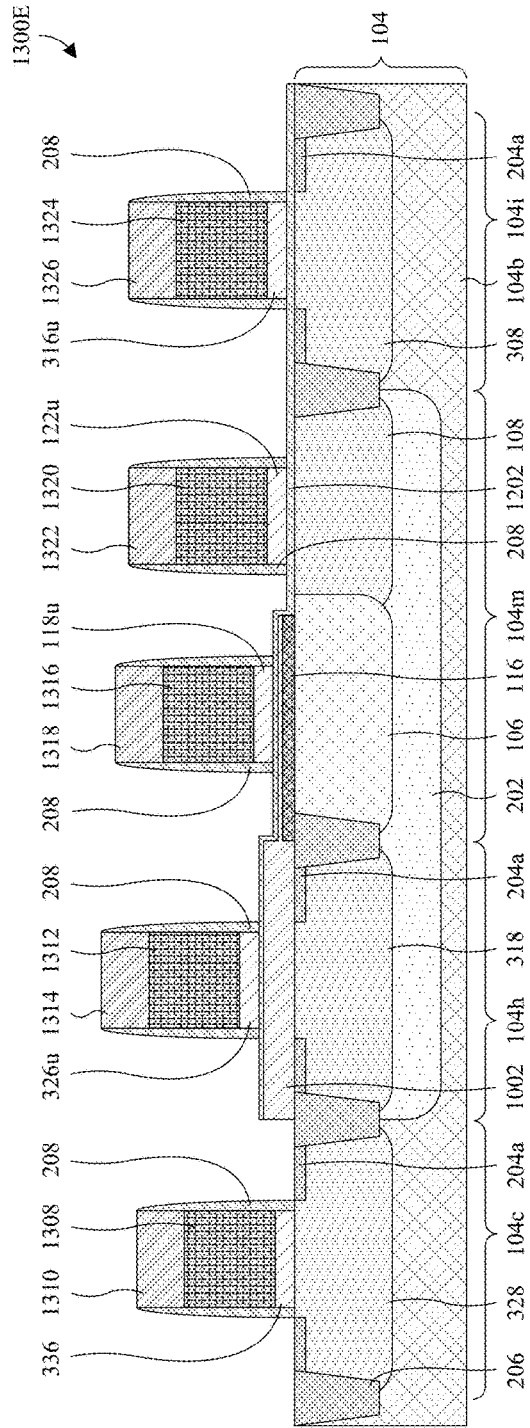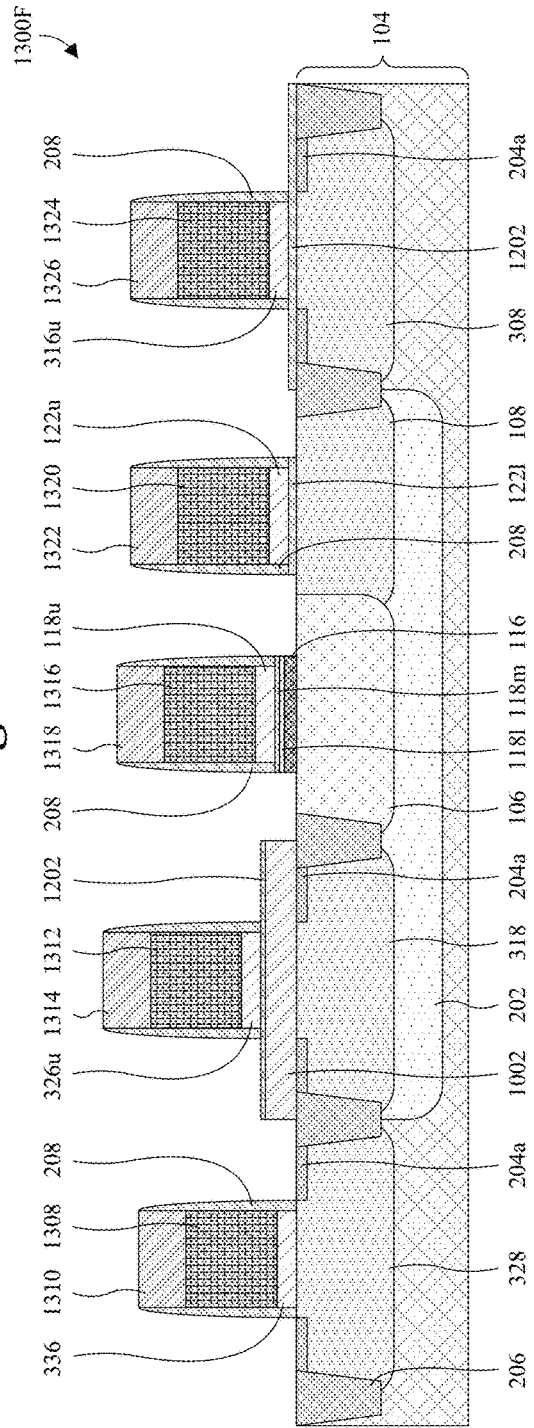

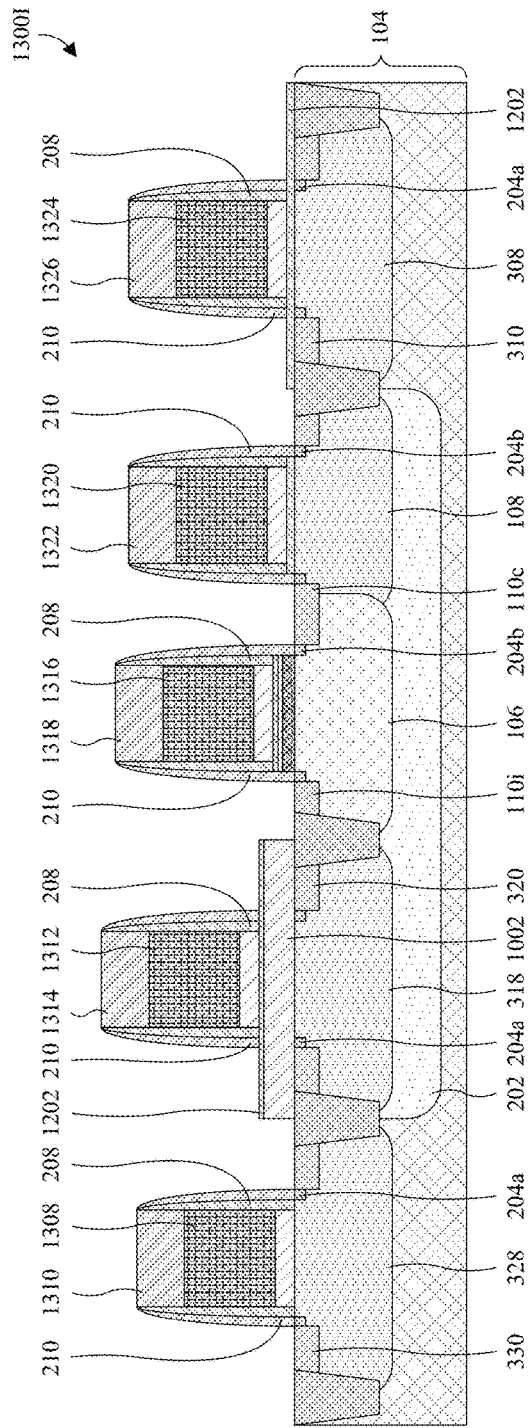
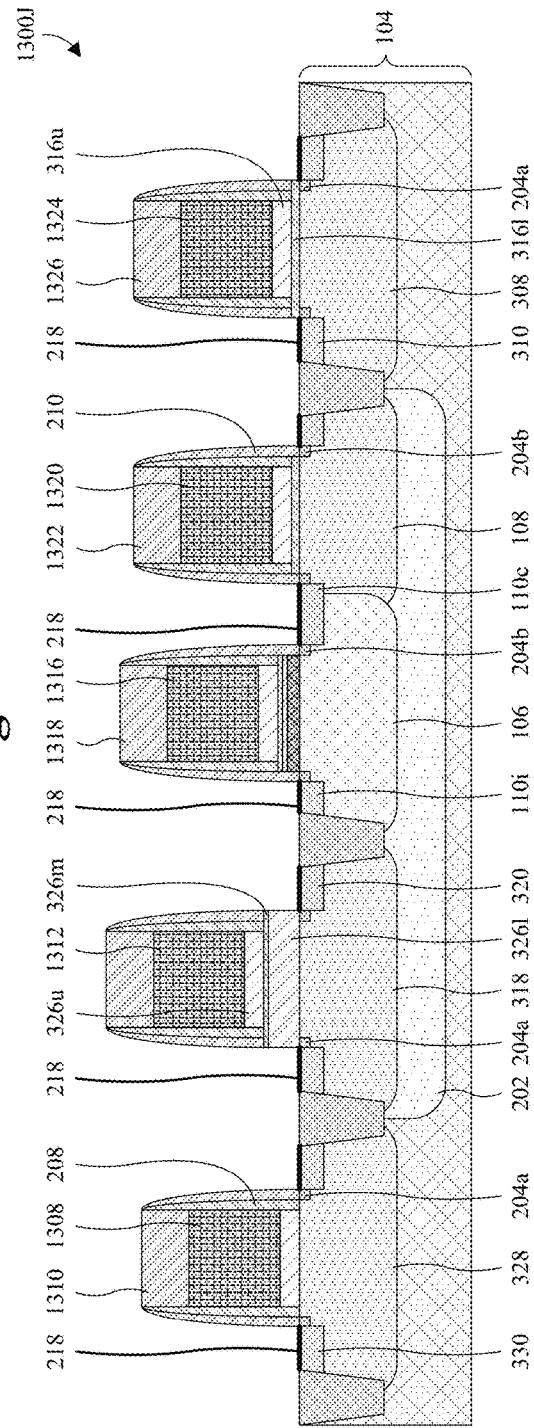
Fig. 13I
Fig. 13J

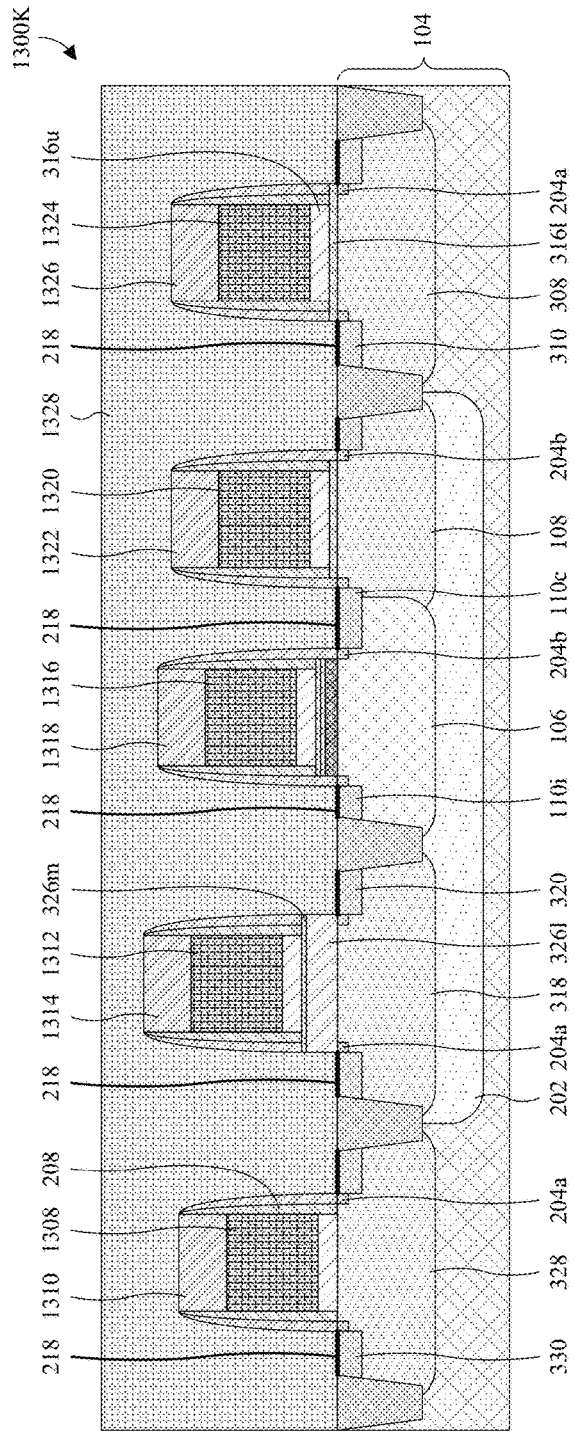
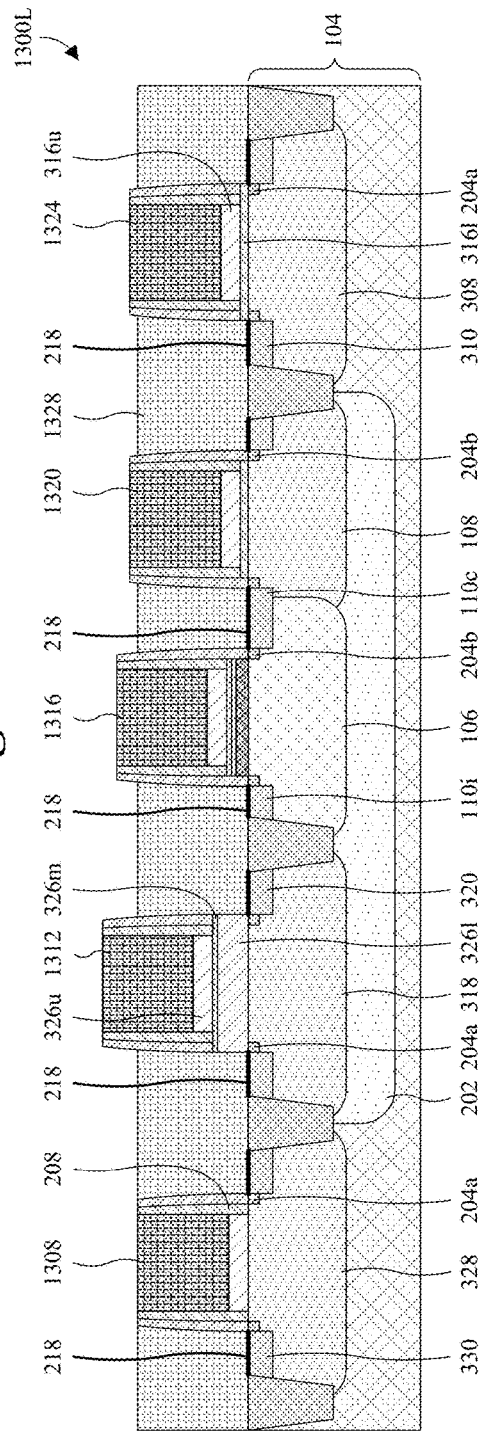
Fig. 13K
Fig. 13L

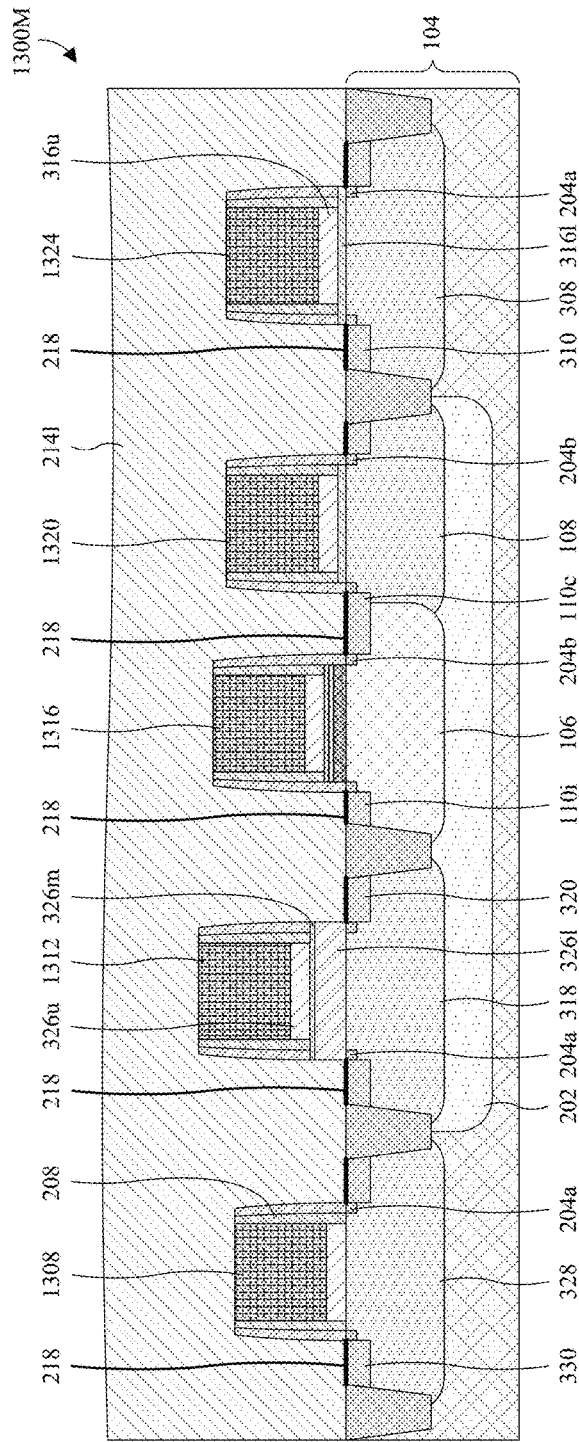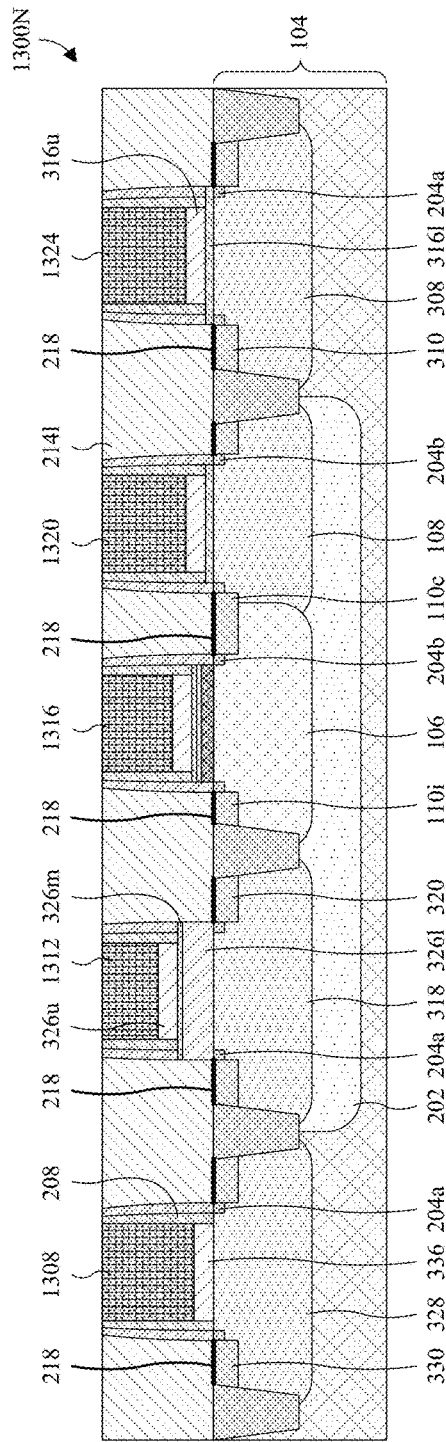
Fig. 13M
Fig. 13N

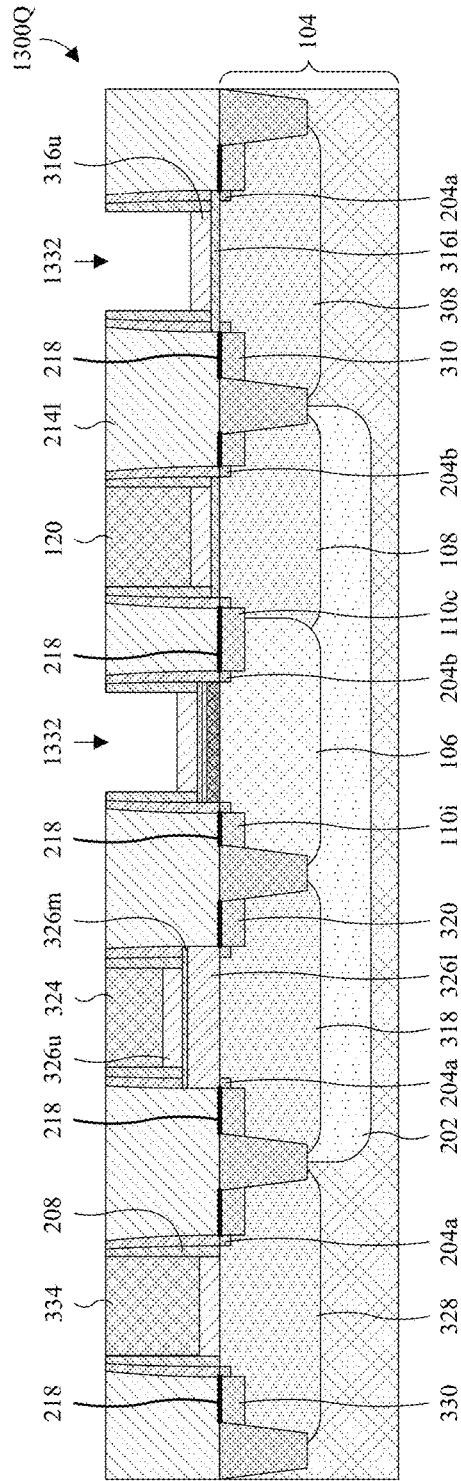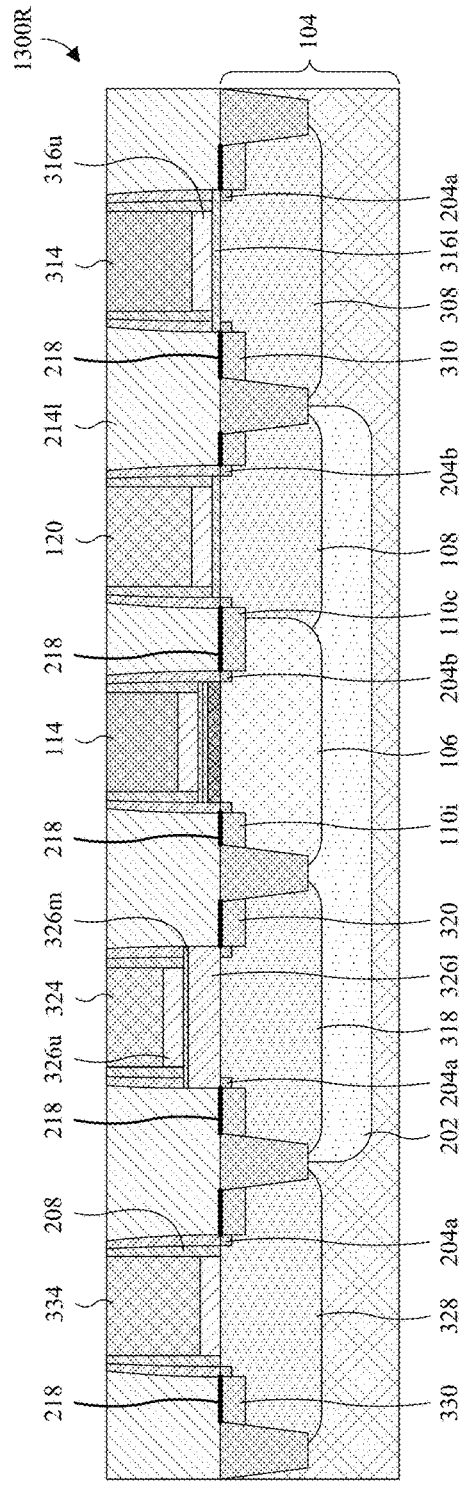

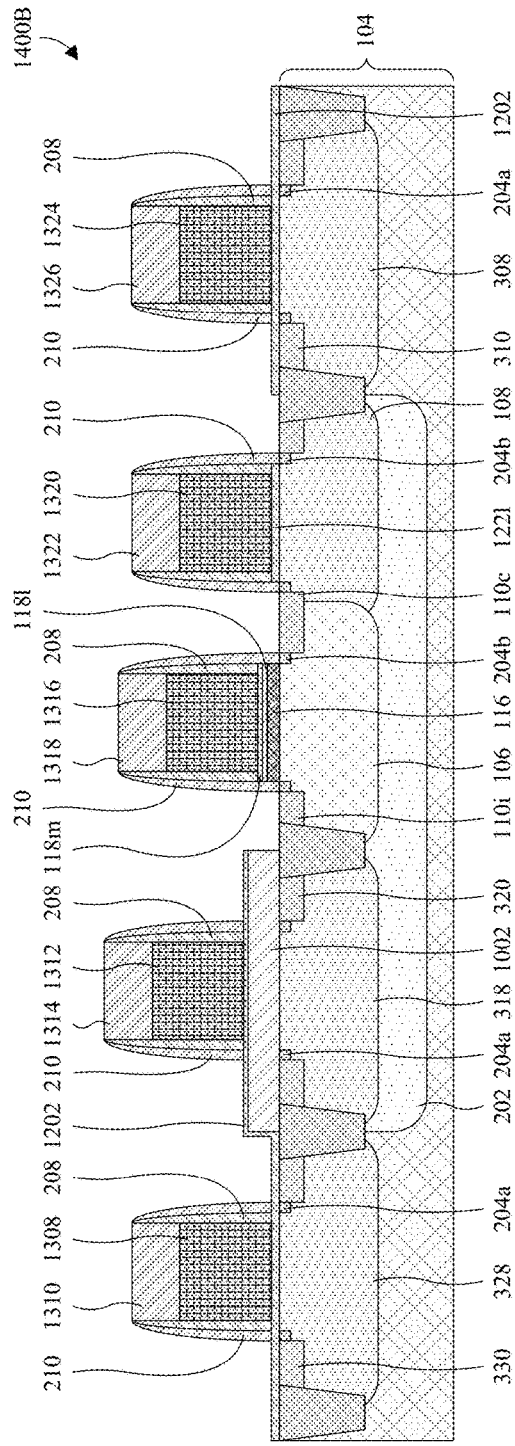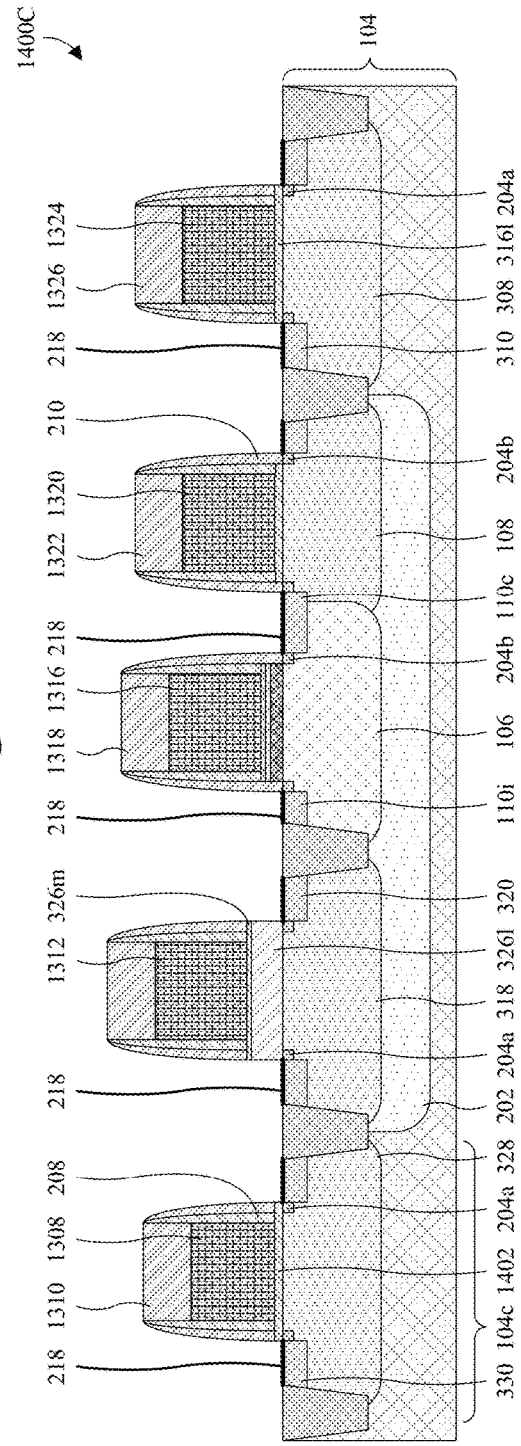
Fig. 14B
Fig. 14C

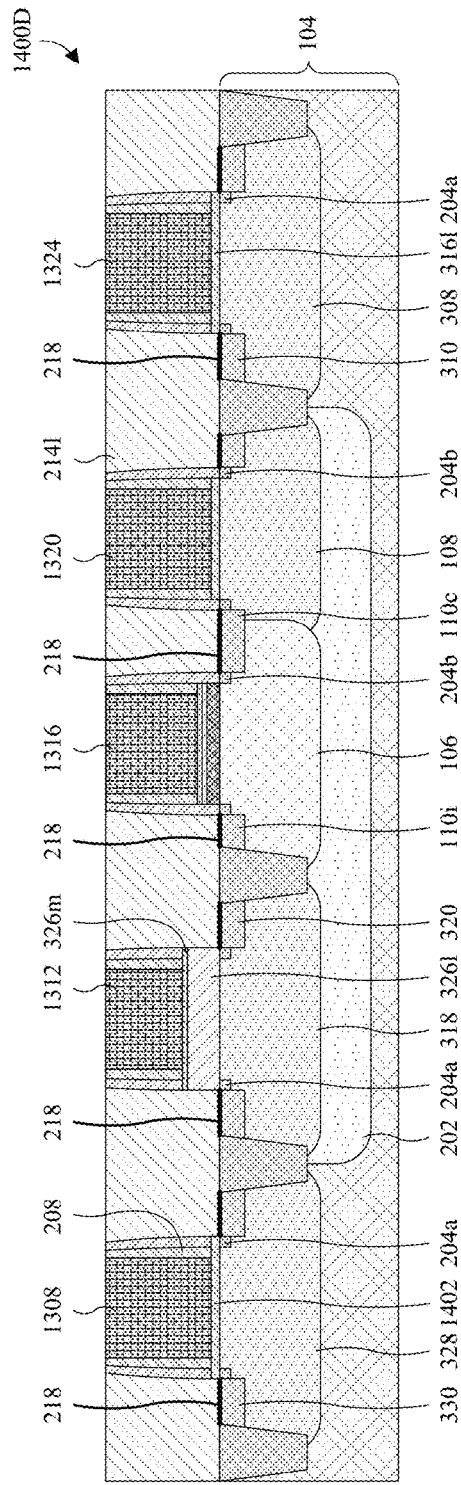
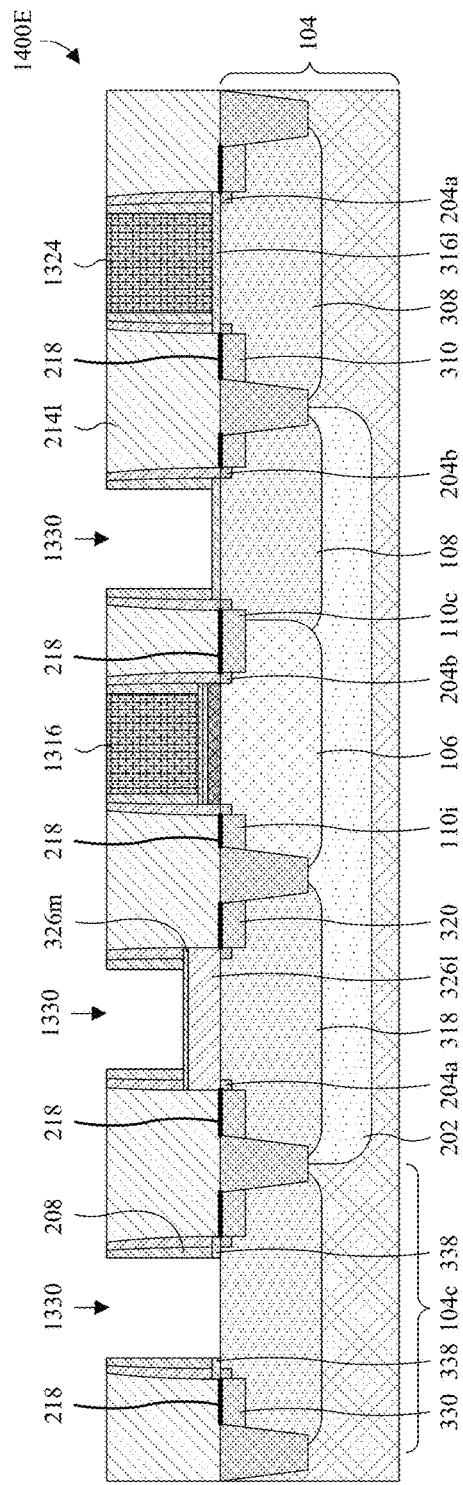
Fig. 14D
Fig. 14E

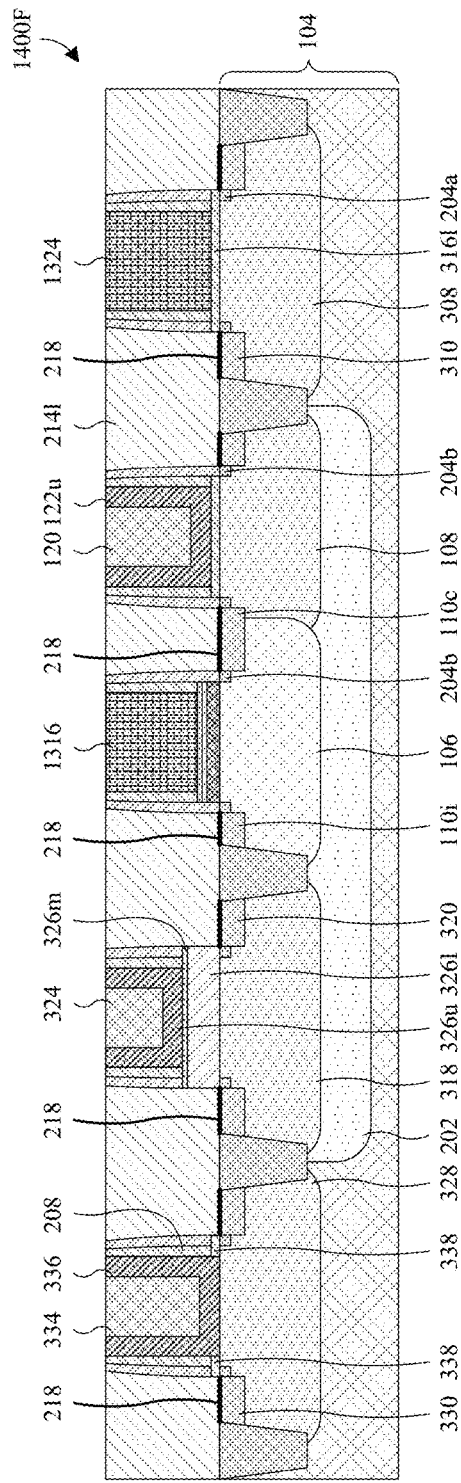
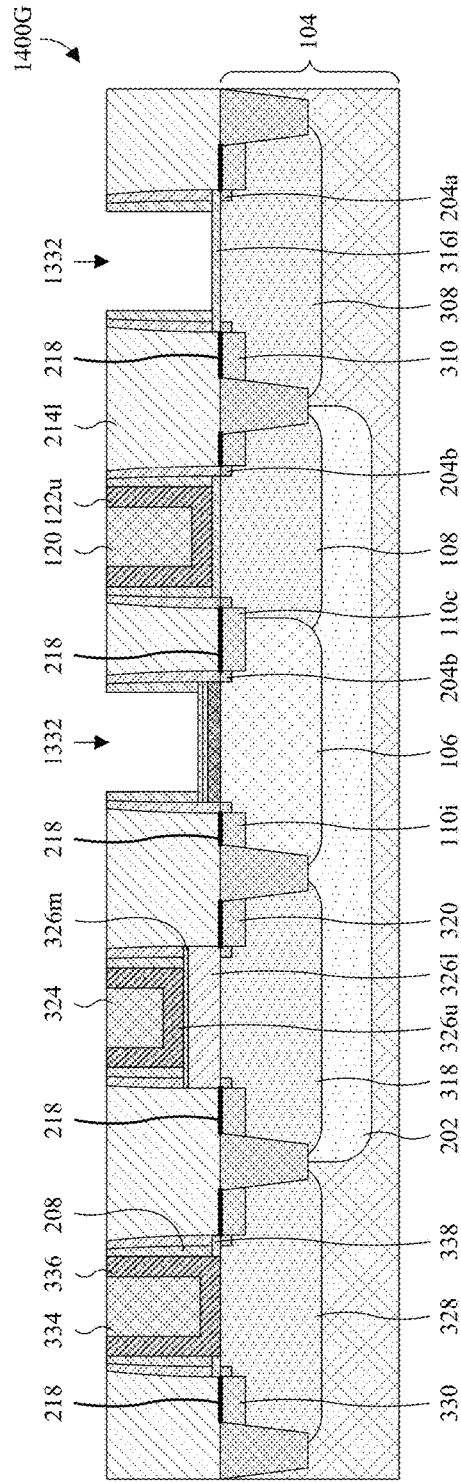
Fig. 14F
Fig. 14G

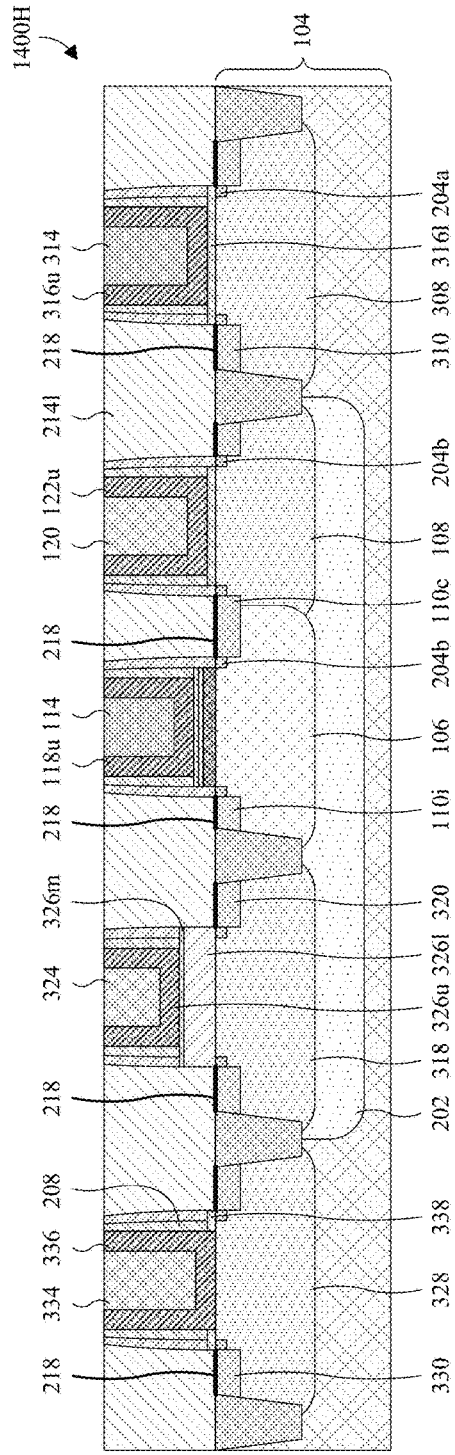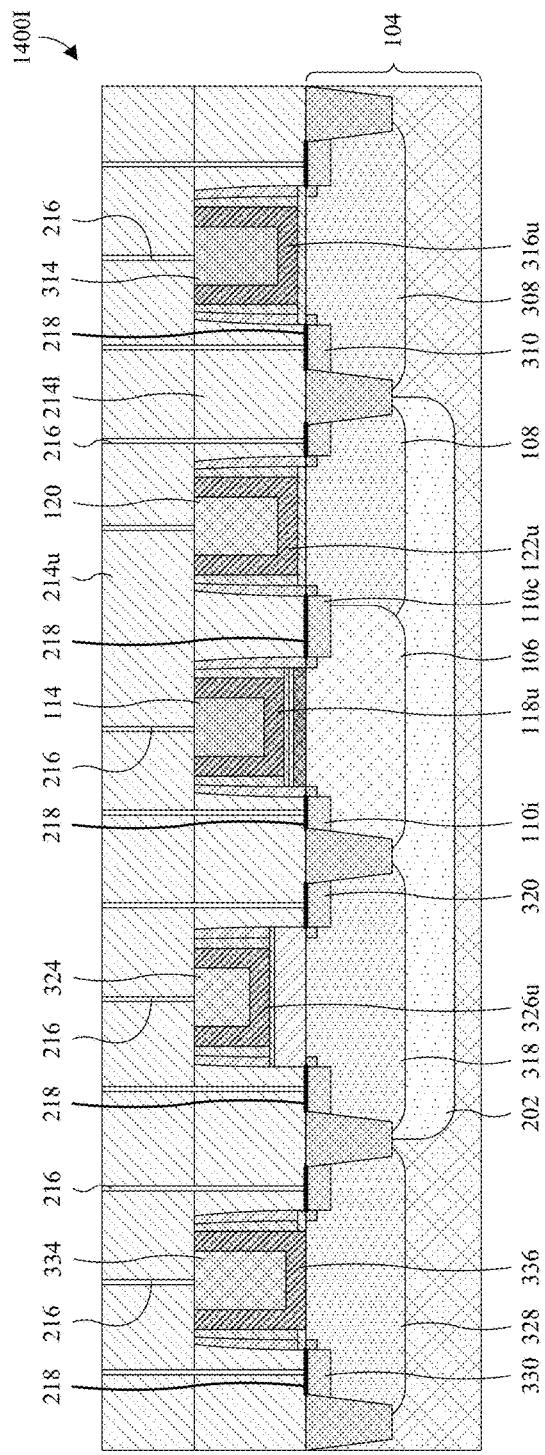
Fig. 14H
Fig. 14I

US 10,510,767 B1

INTEGRATED CIRCUIT AND METHOD FOR MANUFACTURING THE SAME

REFERENCE TO RELATED APPLICATIONS

This application is a Divisional of U.S. application Ser. No. 15/935,277, filed on Mar. 26, 2018, which claims the benefit of U.S. Provisional Application No. 62/552,149, filed on Aug. 30, 2017. The contents of the above-referenced Patent Applications are hereby incorporated by reference in their entirety.

BACKGROUND

The integrated circuit (IC) manufacturing industry has experienced exponential growth over the last few decades. As ICs have evolved, functional density (i.e., the number of interconnected devices per chip area) has generally increased while geometry size (i.e., the smallest component that can be created) has decreased. Some advancements in the evolution of ICs include embedded memory technology and high κ metal gate (HKMG) technology. Embedded memory technology is the integration of memory devices with logic devices on the same semiconductor chip. HKMG technology is the manufacture of semiconductor devices using metal gate electrodes and high-K gate dielectric layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4-7, 8A, 8B, 9-12, 13A-13S, and 14A-14I illustrate a series of cross-sectional views of some embodiments of a method for forming a memory cell with a large operation window and a high erase speed.

DETAILED DESCRIPTION

Figure 1:
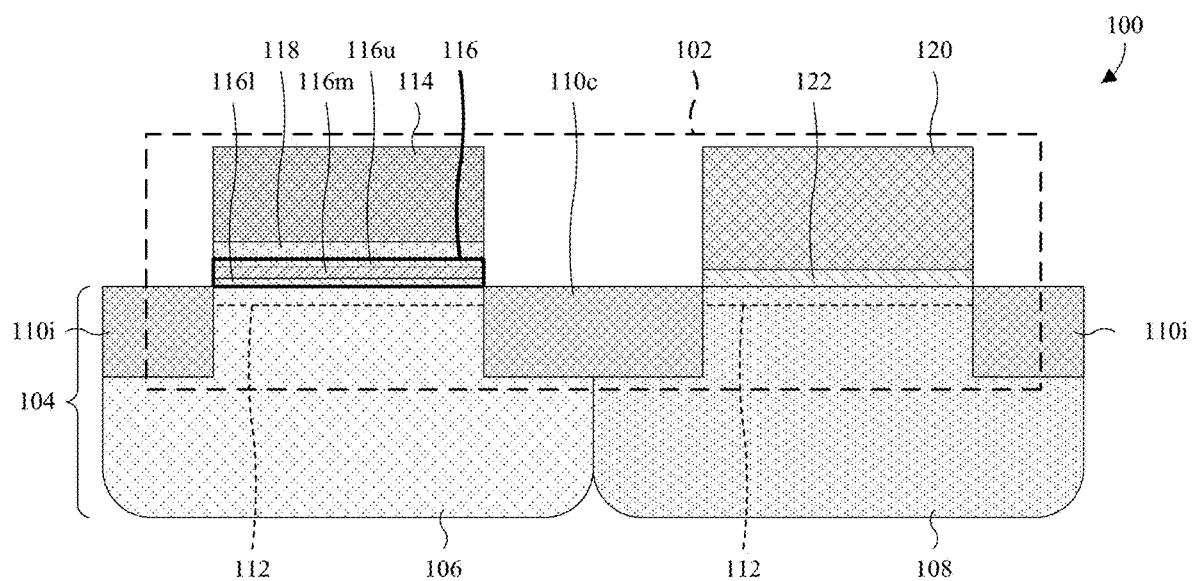
FIG. 1 illustrates a cross-sectional view of some embodiments of an integrated circuit (IC) comprising a memory cell with a large operation window and a high erase speed.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

In some cases, an integrated circuit (IC) comprises a semiconductor substrate and a memory cell. The memory cell is on the semiconductor substrate and may be, for example, a two transistor (2T) silicon-oxide-nitride-oxide-silicon (SONOS) memory cell. A p-type control gate well and a p-type select gate well border in the semiconductor substrate. An n-type common source/drain is in the semiconductor substrate, between the p-type control and select gate wells. An n-type polysilicon select gate electrode overlies the p-type select gate well and is on a first side of the n-type common source/drain. A charge trapping layer and an n-type polysilicon control gate electrode are stacked on the p-type control gate well and are on a second side of the n-type common source/drain that is opposite the first side. Further, the charge trapping layer and the n-type polysilicon control gate electrode overly a selectively-conductive channel in the semiconductor substrate. The selectively-conductive channel extends from the common source/drain to an individual source/drain on an opposite side of the n-type polysilicon control gate electrode as the common source/drain.

During use of the memory cell, the various conductive components (e.g., the n-type polysilicon control gate electrode and the common source/drain) of the memory cell are selectively biased to vary the amount of charge stored in the charge trapping layer. In an erased state, the charge trapping layer stores a low amount of charge. In a programmed state, the charge trapping layer stores a high amount of charge. The low amount of charge represents a first data value, and the high amount of charge represents a second data value, such that the charge trapping layer stores a bit of data. Also, during use of the memory cell, the selectively-conductive channel selectively conducts depending upon whether the n-type polysilicon control gate electrode is biased with a voltage exceeding a threshold voltage. The charge in the charge trapping layer screens an electric field produced by the n-type polysilicon control gate electrode, such that the threshold voltage changes depending upon the amount of charge stored by the charge trapping layer. Therefore, the data state of the charge trapping layer may be read by biasing the n-type polysilicon control gate electrode with a voltage between the threshold voltage in the programmed state and the threshold voltage in the erased state.

The voltage range from the threshold voltage in the programmed state to the threshold voltage in the erase state is known as the operation window. The larger the operation window, the more resilient the memory cell is to process variation and noise while reading the data state of the memory cell. For example, if the operation window is small, noise may have a sufficient amplitude to increase or decrease the voltage at which the n-type polysilicon control gate electrode is biased during a read operation to outside the operation window, whereby the read operation may return an improper result. As another example, where the memory cell is bulk manufactured, process variation may cause the operation window to vary for each instance of the memory cell. If the operation window is small, the likelihood of memory cell instances having operation windows that do not overlap with specification limits increases. This, in turn, may lead to low bulk manufacturing yields and high manufacturing costs.

A first challenge with the IC is that the n-type polysilicon control gate electrode has a low work function. The low work function may result in the memory cell having a small operation window, easy electron back gate injection, a slow erase speed, high erase saturation, or any combination of the foregoing. Namely, to achieve a high erase speed, a high erase voltage is typically used. However, the low work function leads to electron back gate injection when using the high erase voltage. Due to the electron back gate injection, electrons are tunneling from the n-type polysilicon control gate electrode to the charge trapping layer while electrons are simultaneously being removed from the charge trapping layer. Eventually, electrons entering the charge trapping layer and electrons leaving the charge trapping layer reach a steady state called the erase saturation level. However, the erase saturation level is high, whereby the memory cell cannot be fully erase. Since the memory cell is not fully erased, the shift in the threshold voltage from the programmed state to the erased state is small, which leads to a small operation window. Further, because electrons are tunneling from the n-type polysilicon control gate electrode to the charge trapping layer while electrons are simultaneously being removed from the charge trapping layer, the electron back gate injection leads to a slow erase speed even if a high erase voltage is being used. A second challenge with the IC is that semiconductor devices based on polysilicon gate electrodes are reaching scaling limits.

A possible solution to the first challenge is to use a p-type polysilicon control gate electrode in place of the n-type polysilicon control gate electrode since the p-type polysilicon control gate electrode has a high work function. However, this solution does not address the second challenge. Further, a p-type polysilicon control gate electrode is not readily integrated with processes for forming the IC. For example, a process for forming the IC may include forming the p-type polysilicon control gate electrode, and subsequently forming n-type source/drains in the p-type control gate well. Forming the n-type source/drains may lead to counter doping of the p-type polysilicon control gate electrode, such that the p-type polysilicon control gate electrode may have a mid-gap work function. As another example, p-type dopants generated during formation of the p-type polysilicon control gate electrode may migrate to the p-type control gate well and change a doping profile of the p-type control gate well, thereby changing performance parameters of the memory cell. Another possible solution to the first challenge is to use the p-type polysilicon control gate electrode in place of the n-type polysilicon control gate electrode, and to further use an n-type control gate well in place of the p-type control gate well. However, p-channel memory cells are not commonly used, whereby p-channel memory cells are not readily integrated into existing ICs.

A possible solution to the second challenge is to use high κ metal gate (HKMG) technology with a metal control gate electrode that has an n-type work function. However, as with the n-type polysilicon control gate electrode, the metal control gate electrode has a low work function. As noted above, the low work function may result in the memory cell having a small operation window, easy electron back gate injection, a slow erase speed, high erase saturation, or any combination of the foregoing.

Various embodiments of the present application are directed towards a memory cell with a large operation window and a high erase speed, as well as a method for forming the memory cell using HKMG technology. In some embodiments, a memory cell is on a semiconductor substrate, and comprises a control gate electrode, a select gate electrode, a charge trapping layer, and a common source/drain. The common source/drain is in the semiconductor substrate and has an n-type doping profile. The charge trapping layer and the control gate electrode are stacked over the semiconductor substrate and are on a first side of the common source/drain. Further, the control gate electrode overlies the charge trapping layer and is or comprises a first metal with a p-type work function. The select gate electrode is over the semiconductor substrate and is on a second side of the common source/drain region that is opposite the first side. Further, in some embodiments, the select gate electrode is or comprises a second metal with an n-type work function.

By using metal with a p-type work function for the control gate electrode, the control gate electrode has a high work function. The high work function leads to difficult electron back gate injection, which leads to a high erase speed and a low erase saturation level. Further, the low erase saturation level leads to a large operation window. The operation window is the voltage range from the control gate threshold voltage in a programmed state to the control gate threshold voltage in an erased state, and a large operation window renders the memory cell more resilient to process variation and noise during read operations. The memory cell may also be integrated into processes for forming the IC with minimal cost (e.g., without additional reticles and/or photomasks). Further yet, metal of the control and select gate electrodes together with high κ gate dielectric layers may allow the memory cell to be scaled for advanced process nodes, such as, for example, 28 nanometer (nm), 20 nm, and smaller process nodes.

With reference to FIG. 1, a cross-sectional view 100 of some embodiments of an IC comprising a memory cell 102 with a large operation window and a high erase speed is provided. The memory cell 102 may, for example, be a 2T metal-oxide-nitride-oxide-silicon (MONOS) memory cell or some other suitable memory cell. As illustrated, a semiconductor substrate 104 comprises a control gate well 106, a select gate well 108, a common memory source/drain 110c, a pair of individual memory source/drains 110i, and a pair of selectively-conductive memory channels 112. The semiconductor substrate 104 may be or comprise, for example, a bulk monocrystalline silicon substrate, a silicon-on-insulator (SOI) substrate, some other suitable semiconductor substrate(s), or any combination of the foregoing. As used herein, a term (e.g., substrate) with a suffix of "(s)" may, for example, be singular or plural.

The control gate well 106 and the select gate well 108 have a first doping type and border in the semiconductor substrate 104. In some embodiments, the control and select gate wells 106, 108 have different doping profiles (e.g., a different doping concentration). The common memory source/drain 110c overlies the control and select gate wells 106, 108, laterally between the control and select gate wells 106, 108. Further, the common memory source/drain 110c has a second doping type opposite the first doping type. The individual memory source/drains 110i respectively overlie the control and select gate wells 106, 108, and are respectively on opposite sides of the common memory source/drain 110c. Further, the individual memory source/drains 110i have the second doping type. The first and second doping types may respectively be, for example, p-type and n-type, or vice versa. The selectively-conductive memory channels 112 are respectively in the control and select gate wells 106, 108, and each extends from the common memory source/drain 110c to a respective one of the individual memory source/drains 110i. In operation of the IC, the selectively-conductive memory channels 112 reversibly change between low resistance states and high resistance states.

A control gate electrode 114, a charge trapping layer 116, and a control gate dielectric layer 118 are stacked on the control gate well 106, laterally between the common memory source/drain 110c and a respective one of the individual memory source/drains 110i. The charge trapping layer 116 and the control gate dielectric layer 118 underlie the control gate electrode 114 and electrically insulate the control gate electrode 114 from the control gate well 106. Further, the control gate dielectric layer 118 overlies the charge trapping layer 116. The charge trapping layer 116 may be, for example, an oxide-nitride-oxide (ONO) film or some other suitable charge trapping layer. In some embodiments, the charge trapping layer 116 comprises a lower oxide layer 116l, a middle nitride layer 116m overlying the lower oxide layer 116l, and an upper oxide layer 116u overlying the middle nitride layer 116m. The control gate dielectric layer 118 may be or comprise, for example, hafnium oxide, aluminum oxide, silicon nitride, some other suitable high κ dielectric(s), silicon oxide, some other suitable dielectric(s), or any combination of the foregoing. As used herein, a high κ dielectric may be or comprise, for example, a dielectric with a dielectric constant κ greater than about 3.9, 5, 10, 15, or 20.

In some embodiments in which the common and individual memory source/drains 110c, 110i are p-type (e.g., the memory cell 102 is a p-channel memory cell), the control gate electrode 114 is or comprises a metal with an n-type work function. As used herein, an n-type work function may, for example, be: 1) a work function within about 0.1 electron volts (eV), about 0.2 eV, or about 0.4 eV of a work function for n-type polycrystalline silicon; 2) a work function less than about 4.0, about 4.2, or about 4.4 eV; 3) a work function between about 3.5-4.4 eV, about 4.0-4.4 eV, or about 3.8-4.5 eV; 4) some other suitable n-type work function; or 5) any combination of the foregoing. The n-type polycrystalline silicon may, for example, have a doping concentration between about $1\times10^{19}$-$1\times10^{20}$ cm$^{-3}$, about $5\times10^{19}$-$8\times10^{19}$ cm$^{-3}$, or about $8\times10^{19}$-$8\times10^{20}$ cm$^{-3}$. Other suitable doping concentrations are, however, amenable. As used herein, a metal with an n-type work function may be or comprise, for example, hafnium, zirconium, titanium, tantalum, aluminum, some other suitable n-type work function metal(s), or any combination of the foregoing.

In some embodiments in which the common and individual memory source/drains 110c, 110i are n-type (e.g., the memory cell 102 is an n-channel memory cell), the control gate electrode 114 is or comprises a metal with a p-type work function. As used herein, the p-type work function may, for example, be: 1) a work function within about 0.1, 0.2, or 0.4 eV of a work function for p-type polycrystalline silicon; 2) a work function greater than about 4.8 eV, about 5.0 eV, or about 5.2 eV; 3) a work function between about 4.8-5.2 eV, about 5.0-5.4 eV, or about 4.6-5.6 eV; 4) some other suitable p-type work function; or 5) any combination of the foregoing. The p-type polycrystalline silicon may, for example, have a doping concentration between about $1\times10^{19}$-$1\times10^{20}$ cm$^{-3}$, about $5\times10^{19}$-$8\times10^{19}$ cm$^{-3}$, or about $8\times10^{19}$-$8\times10^{20}$ cm$^{-3}$. Other suitable doping concentrations are, however, amenable. As used herein, a metal with a p-type work function may be, for example, ruthenium, palladium, platinum, cobalt, nickel, titanium aluminum nitride, tungsten carbon nitride, some other suitable p-type work function metal(s), or any combination of the foregoing.

During use of the memory cell 102, the various conductive components (e.g., the control gate electrode 114) of the memory cell 102 are selectively biased to vary the amount of charge stored in the charge trapping layer 116. In an erased state, the charge trapping layer 116 stores a low amount of charge. In a programmed state, the charge trapping layer 116 stores a high amount of charge. The low amount of charge represents a first data value, and the high amount of charge represents a second data value, such that the charge trapping layer 116 stores a bit of data. Also, during use of the memory cell 102, one of the selectively-conductive memory channels 112 underlying the control gate electrode 114 selectively conducts depending upon whether the control gate electrode 114 is biased with a voltage exceeding a threshold voltage. The charge in the charge trapping layer 116 screens an electric field produced by the control gate electrode 114, such that the threshold voltage changes depending upon the amount of charge stored by the charge trapping layer 116. Therefore, the data state of the charge trapping layer 116 may be read by biasing the control gate electrode 114 with a voltage between the threshold voltage in the programmed state and the threshold voltage in the erased state. As noted above, this range of voltages is known as the operation window.

By using a metal with a p-type work function for the control gate electrode 114, the control gate electrode 114 has a high work function, which leads to difficult electron back gate injection during erasure of the charge trapping layer 116. Electron back gate injection is the tunneling of electrons from the control gate electrode 114 to the charge trapping layer 116 under the influence of a high electric field (e.g., from a high erase voltage). Because electron back gate injection is difficult, the erase saturation level is low. The erase saturation level is the level at which electrons entering the charge trapping layer 116 due electron back gate injection and electrons leaving the charge trapping layer 116 due to erasure reach a steady state (i.e., balance out). Because of the low erase saturation level, the charge trapping layer 116 may be fully or almost fully erased. Further, the difference between the control gate threshold voltage in the erased state and the control gate threshold voltage in the programmed state is large, whereby the operation window is large. Because the operation window is large, the memory cell 102 may, for example, be resilient to process variation and noise during read operations. Additionally, because of the high work function of the control gate electrode 114, a high erase voltage may be used without succumbing to easy electron back gate injection, a high erase saturation level, and a small operation window. Accordingly, erase speed may be high.

A select gate electrode 120 and a select gate dielectric layer 122 are stacked on the select gate well 108, laterally between the common memory source/drain 110c and a respective one of the individual memory source/drains 110i. The select gate dielectric layer 122 underlies the select gate electrode 120 and electrically insulates the select gate electrode 120 from the select gate well 108. The select gate dielectric layer 122 may be or comprise, for example, hafnium oxide, aluminum oxide, silicon nitride, some other suitable high κ dielectric(s), silicon oxide, some other suitable dielectric(s), or any combination of the foregoing. The select gate electrode 120 may be or comprise, for example, doped polysilicon, a metal, some other suitable conductive material(s), or any combination of the foregoing.

In some embodiments, the control gate electrode 114 is or comprises a metal with a p-type work function, the select gate electrode 120 is or comprises a metal with an n-type work function, and the common and individual memory source/drains 110c, 110i are n-type. In other embodiments, the control gate electrode 114 is or comprises a metal with an n-type work function, the select gate electrode 120 is or comprises a metal with a p-type work function, and the common and individual memory source/drains 110c, 110i are p-type. In yet other embodiments, the control gate electrode 114 is or comprises a metal with a work function of a first doping type (e.g., n-type or p-type), the select gate electrode 120 is or comprises a metal with a work function of the first doping type, and the common and individual memory source/drains 110c, 110i are a second doping type (e.g., p-type or n-type) opposite the first doping type.

By using metal for the control and select gate electrodes 114, 120 and high κ dielectrics for the control and select gate dielectric layers 118, 122 (i.e., by using HKMG technology), the memory cell 102 may be scaled for advanced process nodes, such as, for example, 28 nm, 20 nm, and smaller process nodes. Further, by using metal for the control and select gate electrodes 114, 120, instead of doped polysilicon, there is no doping process to form the control and select gate electrodes 114, 120, such that performance parameters of the memory cell 102 may be more uniform during bulk manufacture. As noted above, a doping process performed to form polysilicon control and select gate electrodes could change the doping profile of control and select gate wells, which could shift performance parameters of a memory cell. Further yet, by using metal for the control and select gate electrodes 114, 120, instead of doped polysilicon, work functions of the control and select gate electrodes 114, 120 can be better controlled. As noted above, a doping process performed to form source/drains could counter dope polysilicon control and select gate electrodes, thereby changing the work functions of the polysilicon control and select gate electrodes.

In some embodiments, the control gate electrode 114 is or comprises a metal with a p-type work function, the select gate electrode 120 is or comprises n-type polysilicon, and the common and individual memory source/drains 110c, 110i are n-type. In other embodiments, the control gate electrode 114 is or comprises a metal with an n-type work function, the select gate electrode 120 is or comprises p-type polysilicon, and the common and individual memory source/drains 110c, 110i are p-type. In yet other embodiments, the control gate electrode 114 is or comprises a metal with a work function of a first doping type (e.g., n-type or p-type), the select gate electrode 120 is or comprises polysilicon with the first doping type, and the common and individual memory source/drains 110c, 110i are a second doping type (e.g., p-type or n-type) opposite the first doping type.

In some embodiments, a difference between a work function of the control gate electrode 114 and a work function of the select gate electrode 120 is about 0.8-1.2 eV, 0.9-1.1 eV, or about 0.5-1.5 eV. However, other suitable work function differences are amenable. In some embodiments (e.g., where the memory cell 102 is an n-channel memory cell), a work function of the control gate electrode 114 is greater than a work function of the select gate electrode 120. In some embodiments (e.g., where the memory cell 102 is a p-channel memory cell), a work function of the control gate electrode 114 is less than a work function of the select gate electrode 120.

While FIG. 1 is illustrated and described as if the control and select gate wells 106, 108 are distinct, it is to be understood that the control and select gate wells 106, 108 may be integrated (e.g., one and the same) in other embodiments. Further, the control and select gate wells 106, 108 may be omitted in yet other embodiments, such that the selectively-conductive memory channels 112 are in a bulk of the semiconductor substrate 104.

Figure 2A:
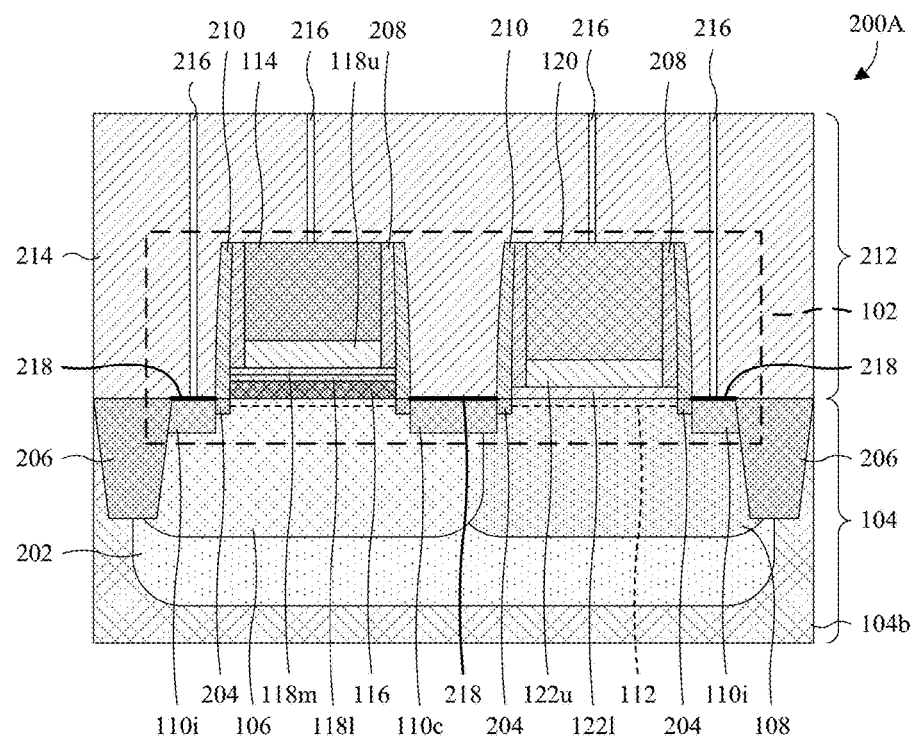
FIGS. 2A and 2B illustrate cross-sectional views of various embodiments of an IC including the features of FIG. 1 and some additional features.

With reference to FIG. 2A, a cross-sectional view 200A of some embodiments of an IC is provided in which the IC includes the features of FIG. 1 and some additional features (discussed hereafter). Further, the features of FIG. 1 are subject to modification (e.g., changes in geometry, location, etc.) to accommodate the additional features. For example, the individual memory source/drains 110i may be laterally spaced from the control and select gate electrodes 114, 120 to accommodate source/drain extensions 204. The IC of FIG. 2A may, for example, be formed according to high κ first embodiments of the method discussed hereafter.

As illustrated, the semiconductor substrate 104 further comprises a bulk semiconductor region 104b underlying the control gate well 106, the select gate well 108, the common memory source/drain 110c, and the individual memory source/drains 110i. In other embodiments, the bulk semiconductor region 104b is doped. For example, the bulk semiconductor region 104b may have a p-type doping profile or an n-type doping profile.

In some embodiments, the semiconductor substrate 104 comprises a deep well 202 underlying the control and select gate wells 106, 108. In some embodiments, the deep well 202 has an opposite doping type as the control and select gate wells 106, 108. For example, the control and select gate wells 106, 108 may be p-type, whereas the deep well 202 may be n-type, or vice versa. In some embodiments, the semiconductor substrate 104 further comprises a plurality of source/drain extensions 204. For ease of illustration, only some of the source/drain extensions 204 are labeled 204. The source/drain extensions 204 overlie the control and select gate wells 106, 108, and each extends laterally from a corresponding source/drain. For example, the common and individual memory source/drains 110c, 110i may be extended by the source/drain extensions 204. The source/drain extensions 204 each have the same doping type, but a lesser doping concentration, than the corresponding source/drain.

An isolation structure 206 extends into a top of the semiconductor substrate 104, and extends laterally along boundaries of the control and select gate wells 106, 108 to enclose the control and select gate wells 106, 108. In some embodiments, the isolation structure 206 has a planar top layout that is ring shaped or some other suitable closed-path shape. The isolation structure 206 may be or comprise, for example, a shallow trench isolation (STI) structure, a deep trench isolation (DTI) structure, or some other suitable isolation structure.

The control gate electrode 114 overlies the control gate well 106 and the charge trapping layer 116, and is electrically insulated from the charge trapping layer 116 by one or more control gate dielectric layers. For example, a lower control gate dielectric layer 118*l*, a middle control gate dielectric layer 118*m*, and an upper control gate dielectric layer 118*u* may be stacked between the control gate electrode 114 and the charge trapping layer 116. The lower and middle control gate dielectric layers 118*l*, 118*m* may be or comprise, for example, silicon oxide, some other suitable dielectric(s), or any combination of the foregoing. The upper control gate dielectric layer 118*u* may be or comprise, for example, hafnium oxide, aluminum oxide, silicon nitride, some other suitable high κ dielectric(s), or any combination of the foregoing.

The select gate electrode 120 overlies the select gate well 108 and is electrically insulated from the select gate well 108 by one or more select gate dielectric layers. For example, a lower select gate dielectric layer 122*l* and an upper select gate dielectric layer 122*u* may be stacked between the select gate electrode 120 and the select gate well 108. The lower select gate dielectric layer 122*l* may be or comprise, for example, silicon oxide, some other suitable dielectric(s), or any combination of the foregoing. The upper select gate dielectric layer 122*u* may be or comprise, for example, hafnium oxide, aluminum oxide, silicon nitride, some other suitable high κ dielectric(s), or any combination of the foregoing.

Gate spacers 208 line sidewalls of the control and select gate electrodes 114, 120. In some embodiments, each of the gate spacers 208 has a pair of segments respectively on opposite sidewalls of a corresponding gate electrode (e.g., the control gate electrode 114 or the select gate electrode 120). The gate spacers 208 may be or comprise, for example, silicon nitride, silicon oxide, some other suitable dielectric(s), or any combination of the foregoing.

Additional spacers 210 line sidewalls of the gate spacers 208 and sidewalls of the charge trapping layer 116. In some embodiments, the additional spacers 210 also line sidewalls of the lower select gate dielectric layer 122*l*, sidewalls of the lower control gate dielectric layer 118*l*, and sidewalls of the middle control gate dielectric layer 118*m*. In some embodiments, each of the additional spacers 210 has a pair of segments respectively on opposite sidewalls of a corresponding one of the gate spacers 208. The additional spacers 210 may be or comprise, for example, silicon oxide, silicon nitride, some other suitable dielectric(s), or any combination of the foregoing.

A back end of line (BEOL) interconnect structure 212 covers the memory cell 102 and includes an interlayer dielectric (ILD) layer 214 and a plurality of contact vias 216. The ILD layer 214 may be or comprise, for example, silicon oxide, silicon nitride, a low κ dielectric, some other suitable dielectric(s), or any combination of the foregoing. As used herein, a low κ dielectric may be or comprise, for example, a dielectric with a dielectric constant κ less than about 3.9, 3, 2, or 1. The contact vias 216 extend through the ILD layer 214 to the control gate electrode 114, the select gate electrode 120, the individual memory source/drains 110*i*, or any combination of the foregoing. The contact vias 216 may be or comprise, for example, tungsten, copper, aluminum copper, aluminum, some other suitable conductive material(s), or any combination of the foregoing.

In some embodiments, silicide pads 218 are respectively on the common and individual memory source/drains 110*c*, 110*i*. The silicide pads 218 reduce contact resistance between the common and individual memory source/drains 110*c*, 110*i* and corresponding ones of the contact vias 216. The silicide pads 218 may be or comprise, for example, nickel silicide, some other suitable silicide(s), or any combination of the foregoing.

Figure 2B:
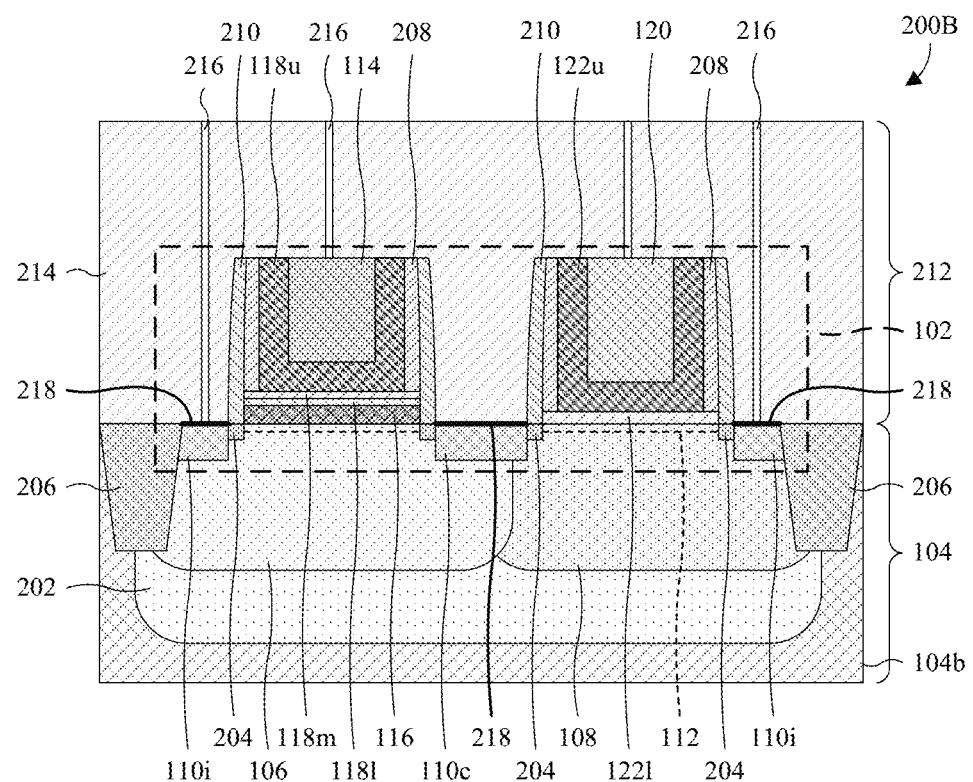

With reference to FIG. 2B, a cross-sectional view 200B of some alternative embodiments of the IC of FIG. 2A is provided in which the upper control and select gate dielectric layers 118*u*, 122*u* respectively cup an underside of the control gate electrode 114 and an underside of the select gate electrode 120. The IC of FIG. 2B may, for example, be formed according to high κ last embodiments of the method discussed hereafter.

Figure 3A:
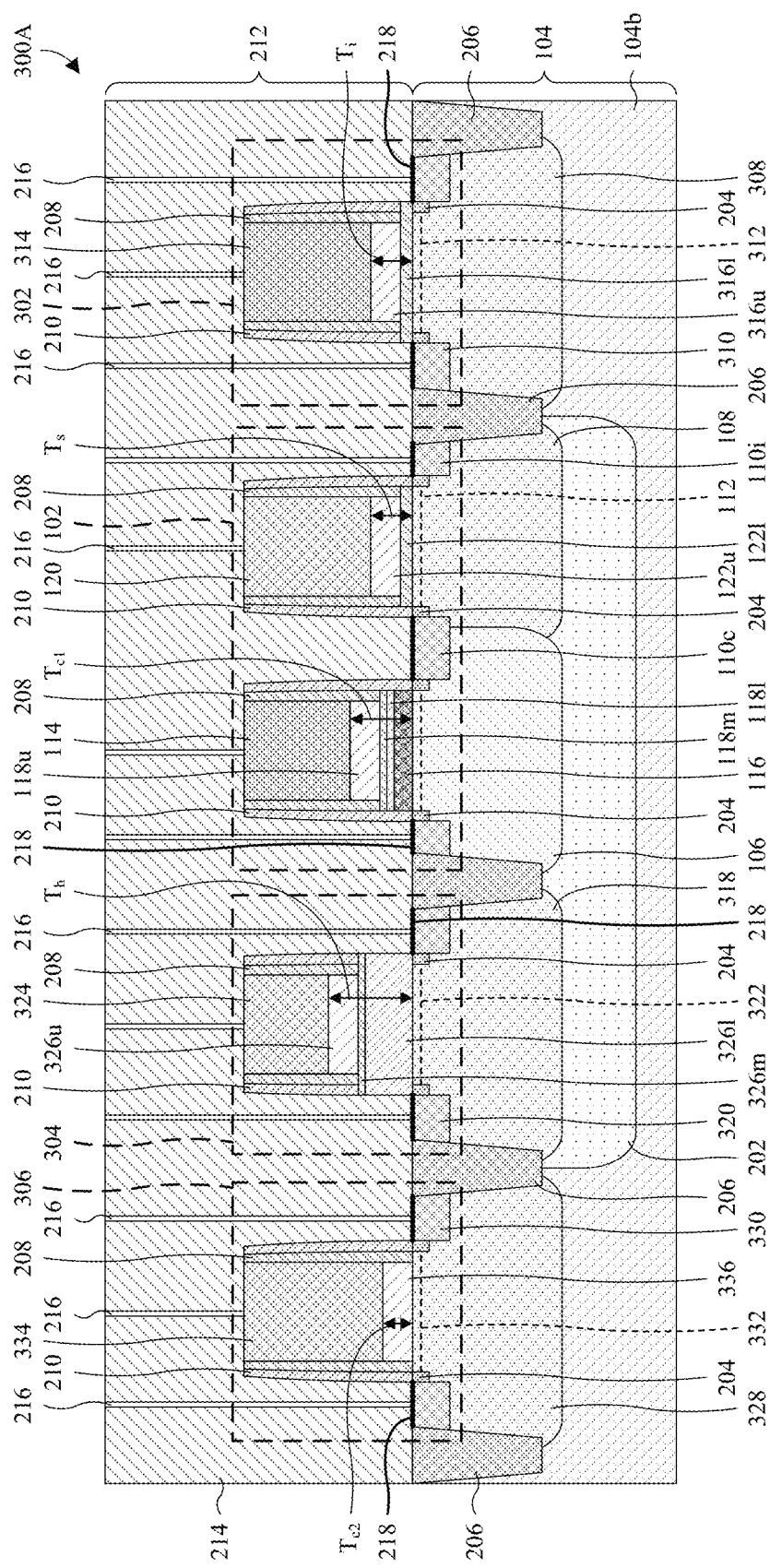
FIGS. 3A and 3B illustrate cross-sectional views of various embodiments of an IC including the memory cell of FIGS. 2A and 2B, and further including an additional semiconductor device (e.g., a high voltage device or a logic device).

With reference to FIG. 3A, a cross-sectional view 300A of some embodiments of an IC is provided in which the IC comprises the memory cell 102 of FIG. 2A and one or more additional semiconductor devices integrated with the memory cell 102. The one or more semiconductor devices may comprise, for example, an input/output (I/O) logic device 302, a high voltage (HV) device 304, and a core logic device 306, some other suitable semiconductor device(s), or any combination of the foregoing. The IC of FIG. 3A may, for example, be formed according to high κ first embodiments of the method discussed hereafter.

The I/O logic device 302 aids in I/O operations for the IC. For example, the I/O logic device 302 and other I/O logic devices (not shown) may collectively implement I/O circuitry for inputting data to, and/or outputting data from, the IC. The HV device 304 is a device that operates at high voltages relative to the I/O logic device 302 and/or the core logic device 306. The high voltages may, for example, be between about 20-50 volts, 10-100 volts, 30-70 volts, or some other suitable high voltages. In some embodiments, the HV device 304 drives bit lines and/or words lines in a memory cell array, which may include the memory cell 102. The core logic device 306 aids in core functions for the IC. For example, the core logic device 306 and other core logic devices (not shown) may collectively implement core circuitry for the IC. Such core circuitry may, for example, include row decoder circuitry, column decoder circuitry, image signal processing (ISP) circuitry, control circuitry, some other suitable core circuitry, or any combination of the foregoing. The I/O logic device 302, the HV device 304, and the core logic device 306 may be or comprise, for example, metal-oxide-semiconductor (MOS) device(s), MOS field-effect transistor(s) (MOSFET(s)), insulated-gate field-effect transistor(s) (IGFET(s)), some other suitable semiconductor device(s), or any combination of the foregoing.

In some embodiments in which the IC comprises the I/O logic device 302, the semiconductor substrate 104 comprises an I/O well 308, a pair of I/O source/drains 310, and a selectively-conductive I/O channel 312. For ease of illustration, only one of the I/O source/drains 310 is labeled 310. The I/O well 308 underlies the I/O source/drains 310 and has a first doping type. In some embodiments, the I/O well 308 is to the side of the deep well 202. In other embodiments, the I/O well 308 overlies the deep well 202. In some embodiments, the isolation structure 206 extends laterally along a boundary of the I/O well 308 to enclose (e.g., completely enclose) the I/O well 308. The I/O source/drains 310 are respectively on opposite sides of the I/O well 308 and have an opposite doping type as the I/O well 308. The selectively-conductive I/O channel 312 is in the I/O well 308 and extends from one of the I/O source/drains 310 to another one of the I/O source/drains 310.

An I/O gate electrode 314 and one or more I/O gate dielectric layers are stacked on the selectively-conductive I/O channel 312, laterally between the I/O source/drains 310. The I/O gate electrode 314 may be or comprise, for example, doped polysilicon, a metal, some other suitable conductive material(s), or any combination of the foregoing. In some embodiments, the I/O source/drains 310 are n-type, and the I/O gate electrode 314 is or comprises a metal with an n-type work function. In some embodiments, the I/O source/drains 310 are p-type, and the I/O gate electrode 314 is or comprises a metal with a p-type work function.

The I/O gate dielectric layer(s) is/are under the I/O gate electrode 314 to electrically insulate the I/O gate electrode 314 from the selectively-conductive I/O channel 312. For example, a lower I/O gate dielectric layer 316l and an upper I/O gate dielectric layer 316u may be stacked between the I/O gate electrode 314 and the selectively-conductive I/O channel 312. The lower I/O gate dielectric layer 316l may be or comprise, for example, silicon oxide, some other suitable dielectric(s), or any combination of the foregoing. The upper I/O gate dielectric layer 316u may be or comprise, for example, hafnium oxide, aluminum oxide, silicon nitride, some other suitable high κ dielectric(s), or any combination of the foregoing. In some embodiments, the I/O gate dielectric layer(s) has/have an I/O dielectric thickness $T_i$ that is less than a control gate dielectric thickness $T_{c1}$, and/or that is about equal to a select gate dielectric thickness $T_s$. The control gate dielectric thickness $T_{c1}$ may, for example, defined by the charge trapping layer 116 and the control gate dielectric layer(s). The select gate dielectric thickness $T_s$ may, for example, be defined by the select gate dielectric layer(s).

In some embodiments in which the IC comprises the HV device 304, the semiconductor substrate 104 comprises a HV well 318, a pair of HV source/drains 320, and a selectively-conductive HV channel 322. For ease of illustration, only one of the HV source/drains 320 is labeled 320. The HV well 318 underlies the HV source/drains 320 and overlies the deep well 202. In some embodiments, the isolation structure 206 extends laterally along a boundary of the HV well 318 to enclose (e.g., completely enclose) the HV well 318. The HV source/drains 320 are respectively on opposite sides of the HV well 318 and have an opposite doping type as the HV well 318. The selectively-conductive HV channel 322 is in the HV well 318 and extends from one of the HV source/drains 320 to another one of the HV source/drains 320.

A HV gate electrode 324 and one or more HV gate dielectric layers are stacked on the selectively-conductive HV channel 322, laterally between the HV source/drains 320. The HV gate electrode 324 may be or comprise, for example, doped polysilicon, a metal, some other suitable conductive material(s), or any combination of the foregoing. In some embodiments, the HV source/drains 320 are n-type, and the HV gate electrode 324 is or comprises a metal with an n-type work function. In some other embodiments, the HV source/drains 320 are p-type, and the HV gate electrode 324 is or comprises a metal with a p-type work function.

The HV gate dielectric layer(s) is/are under the HV gate electrode 324 to electrically insulate the HV gate electrode 324 from the selectively-conductive HV channel 322. For example, a lower HV gate dielectric layer 326l, a middle HV gate dielectric layer 326m, and an upper HV gate dielectric layer 326u may be stacked between the HV gate electrode 324 and the selectively-conductive HV channel 322. The lower and middle HV gate dielectric layers 326l, 326m may be or comprise, for example, silicon oxide, some other suitable dielectric(s), or any combination of the foregoing. The upper HV gate dielectric layer 326u may be or comprise, for example, hafnium oxide, aluminum oxide, silicon nitride, some other suitable high κ dielectric(s), or any combination of the foregoing. In some embodiments, the HV gate dielectric layer(s) has/have an HV dielectric thickness $T_h$ greater than the control gate dielectric thickness $T_{c1}$ and/or the select gate dielectric thickness $T_s$. In some embodiments, the HV dielectric thickness $T_h$ is also greater than the I/O dielectric thickness $T_i$. As should be appreciated, the HV dielectric thickness $T_h$ is greater than the other dielectric thicknesses (e.g., the I/O dielectric thickness $T_i$) because the HV device 304 operates at higher voltages.

In some embodiments in which the IC comprises the core logic device 306, the semiconductor substrate 104 comprises a core well 328, a pair of core source/drains 330, and a selectively-conductive core channel 332. For ease of illustration, only one of the core source/drains 330 is labeled 330. The core well 328 underlies the core source/drains 330. In some embodiments, the core well 328 is to the side of the deep well 202. In other embodiments, the core well 328 overlies the deep well 202. In some embodiments, the isolation structure 206 extends laterally along a boundary of the core well 328 to enclose (e.g., completely enclose) the core well 328. The core source/drains 330 are respectively on opposite sides of the core well 328 and have an opposite doping type as the core well 328. The selectively-conductive core channel 332 is in the core well 328 and extends from one of the core source/drains 330 to another one of the core source/drains 330.

A core gate electrode 334 and a core gate dielectric layer 336 are stacked on the selectively-conductive core channel 332, laterally between the core source/drains 330. The core gate electrode 334 overlies the core gate dielectric layer 336 and may be or comprise, for example, doped polysilicon, a metal, some other suitable conductive material(s), or any combination of the foregoing. In some embodiments, the core source/drains 330 are n-type, and the core gate electrode 334 is or comprises a metal with an n-type work function. In some other embodiments, the core source/drains 330 are p-type, and the core gate electrode 334 is or comprises a metal with a p-type work function. The core gate dielectric layer 336 may be or comprise, for example, hafnium oxide, silicon nitride, aluminum oxide, some other suitable high κ dielectric(s), or any combination of the foregoing. In some embodiments, the core gate dielectric layer 336 has a core dielectric thickness $T_{c2}$ less than the control gate dielectric thickness $T_{c1}$ and/or the select gate dielectric thickness $T_s$. In some embodiments, the core dielectric thickness $T_c$ is also less than the I/O dielectric thickness $T_i$ and/or the HV dielectric thickness $T_h$.

In some embodiments, the source/drain extensions 204 extend the I/O source/drains 310, the HV source/drains 320, the core source/drains 330, or any combination of the foregoing. For ease of illustration, only some of the source/drain extensions 204 are labeled 204. In some embodiments, the gate spacers 208 line sidewalls of the I/O gate electrode 314, sidewalls of the HV gate electrode 324, sidewalls of the core gate electrode 334, or any combination of the foregoing. In some embodiments, the additional spacers 210 line sidewalls of the gate spacers 208 on the I/O well 308, the HV well 318, the core well 328, or any combination of the foregoing.

The BEOL interconnect structure 212 covers the memory cell 102 and the additional semiconductor device(s) (e.g., the I/O logic device 302). The BEOL interconnect structure 212 includes the ILD layer 214 and the plurality of contact vias 216. For ease of illustration, only some of the contact vias 216 are labeled 216. The contact vias 216 extend through the ILD layer 214 to the select gate electrode 120, the control gate electrode 114, the individual memory source/drains 110i, or any combination of the foregoing. In some embodiments, the contact vias 216 also extend through the ILD layer 214 to the I/O gate electrode 314, the I/O source/drains 310, the HV gate electrode 324, the HV source/drains 320, the core gate electrode 334, the core source/drains 330, or any combination of the foregoing.

In some embodiments, the silicide pads 218 are respectively on the common memory source/drain 110c and the individual memory source/drains 110i. Further, in some embodiments, the silicide pads 218 are respectively on the I/O source/drains 310, the HV source/drains 320, the core source/drains 330, or any combination of the foregoing. For ease of illustration, only some of the silicide pads 218 are labeled 218.

Figure 3B:
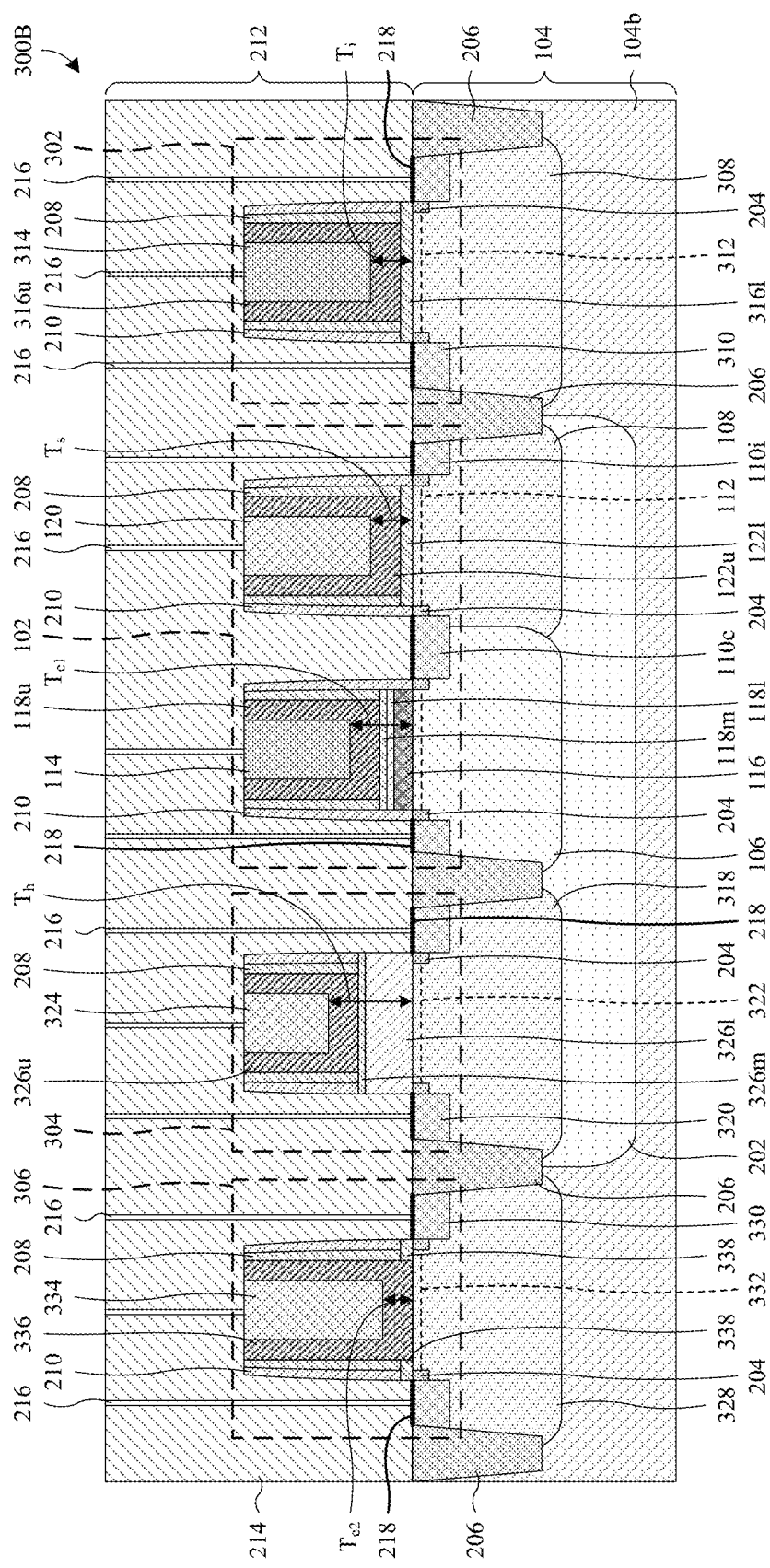

With reference to FIG. 3B, a cross-sectional view 300B of some alternative embodiments of the IC of FIG. 3A is provided in which the upper control and select gate dielectric layers 118u, 122u respectively cup an underside of the control gate electrode 114 and an underside of the select gate electrode 120. Further, the upper I/O gate dielectric layer 316u, the upper HV gate dielectric layer 326u, and the core gate dielectric layer 336 respectively cup an underside of the I/O gate electrode 314, an underside of the HV gate electrode 324, and an underside of the core gate electrode 334. The IC of FIG. 3A may, for example, be formed according to high κ last embodiments of the method discussed hereafter.

In some embodiments, a residual dielectric layer 338 underlies the gate and additional spacers 208, 210 on the core well 328. In some embodiments, the residual dielectric layer 338 has a pair of segments respectively on opposite sidewalls of the core gate dielectric layer 336. The residual dielectric layer 338 may be or comprise, for example, silicon oxide, some other suitable dielectric(s), or any combination of the foregoing.

With reference to FIGS. 4-7, 8A, 8B, 9-12, 13A-13S, and 14A-14I, a series of cross-sectional views 400-700, 800A, 800B, 900-1200, 1300A-1300S, 1400A-1400I of various embodiments of a method for forming the ICs of FIGS. 3A and 3B is provided. FIGS. 13A-13S are alternatives to FIGS. 14A-14I, such that the method may proceed from the acts of FIG. 12 to either: 1) the acts of FIGS. 13A-13S; or 2) the acts of FIGS. 14A-14I.

Figure 12:
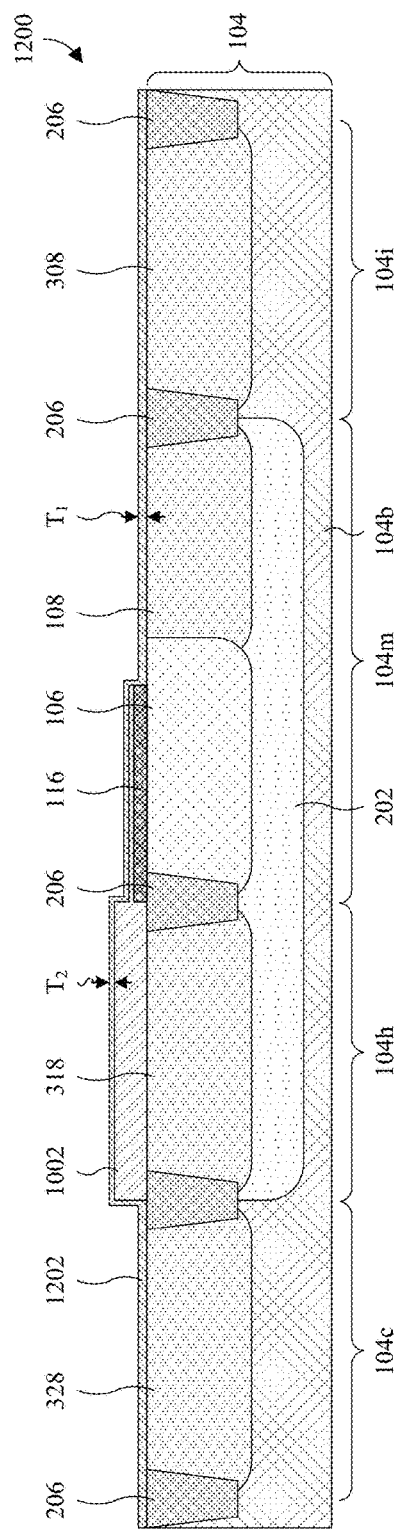
Figure 13C:
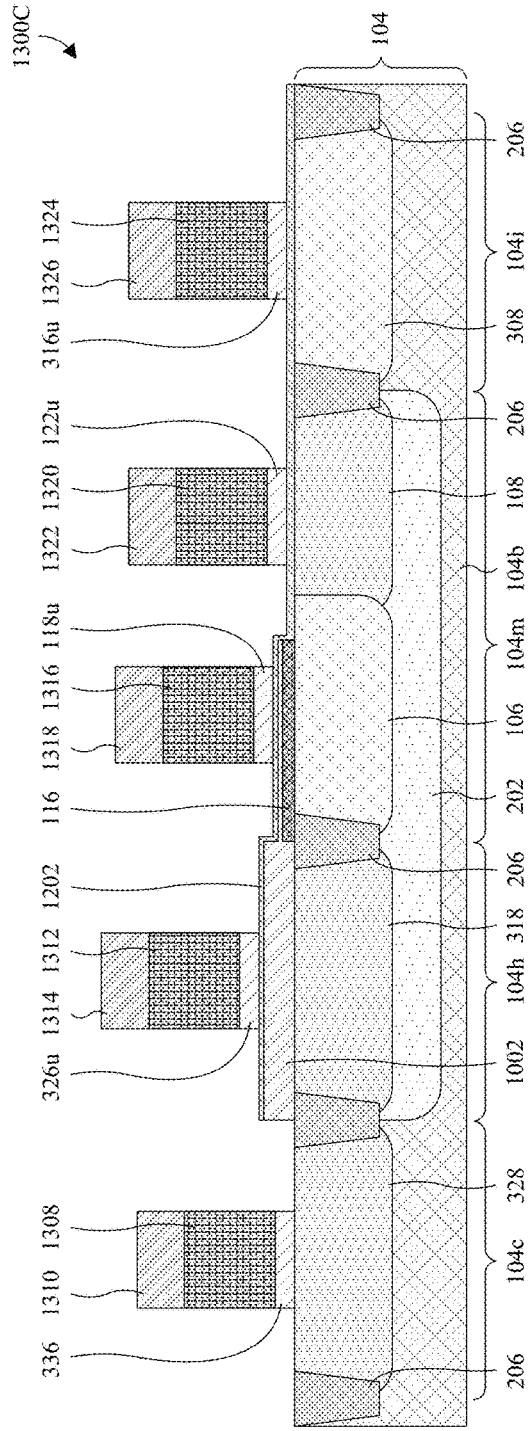
Figure 13D:
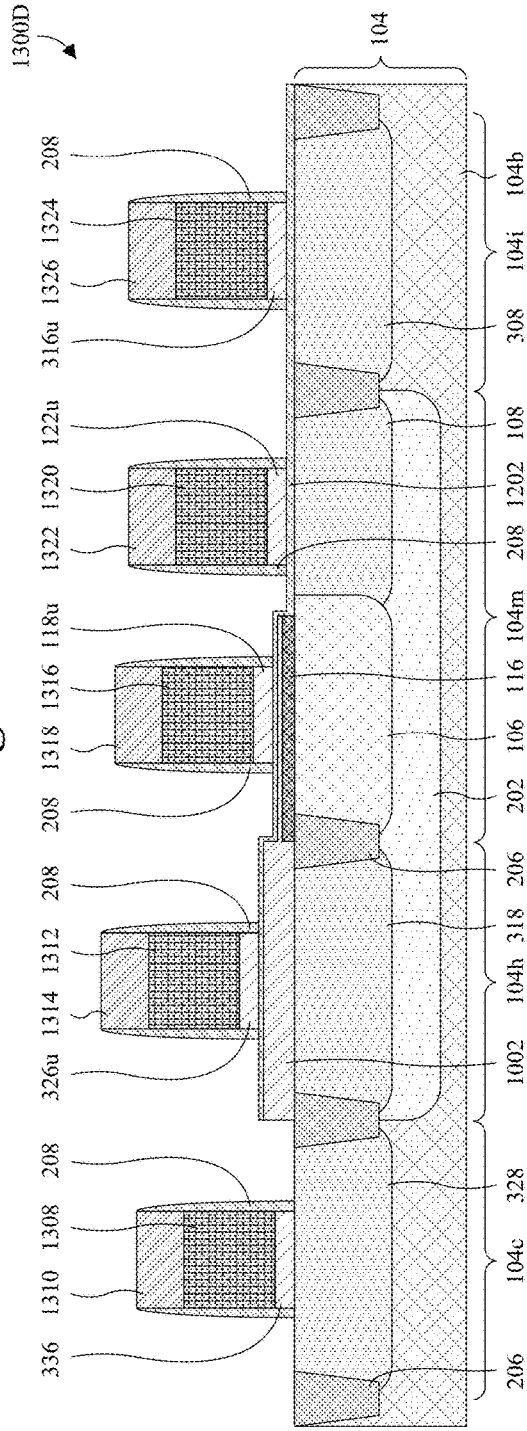
Figure 13G:
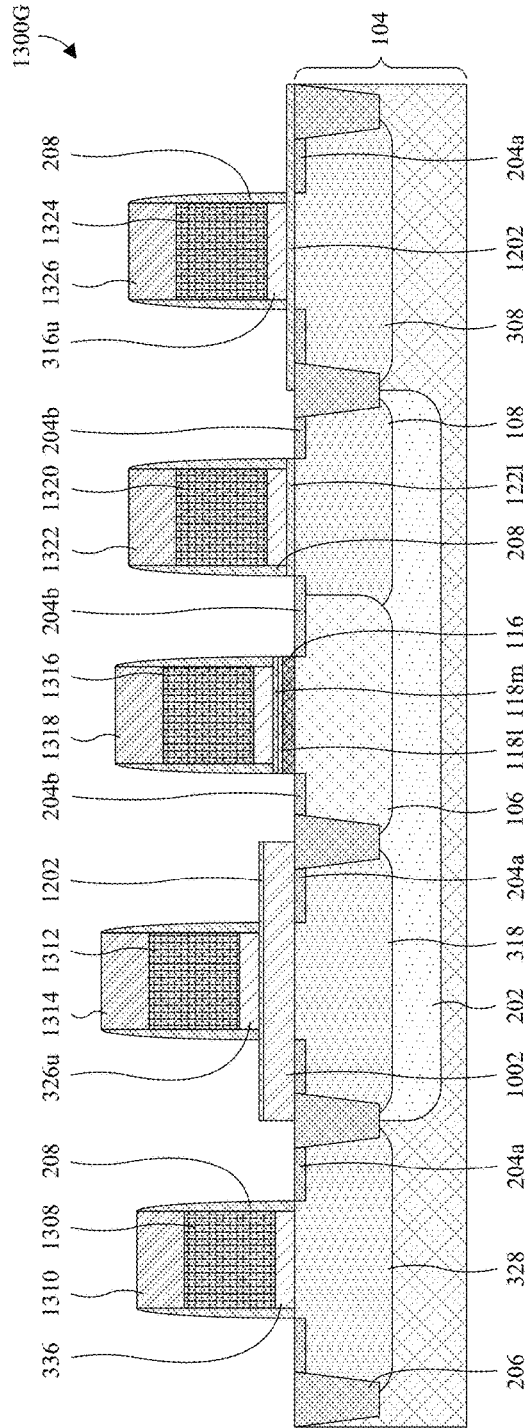
Figure 13H:
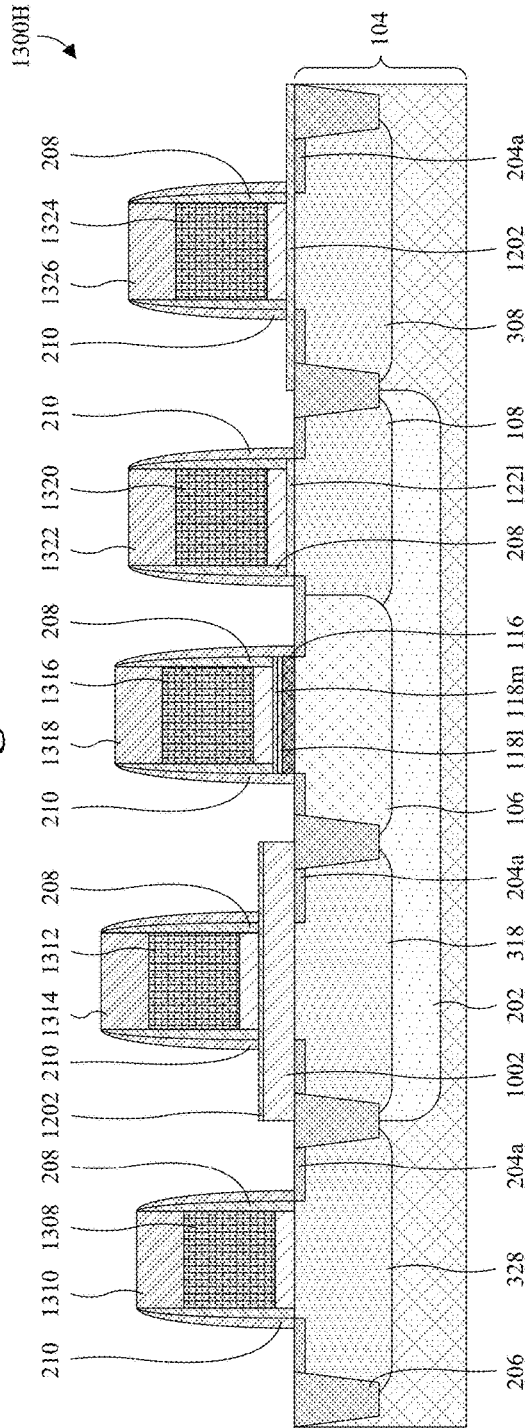
Figure 13O:
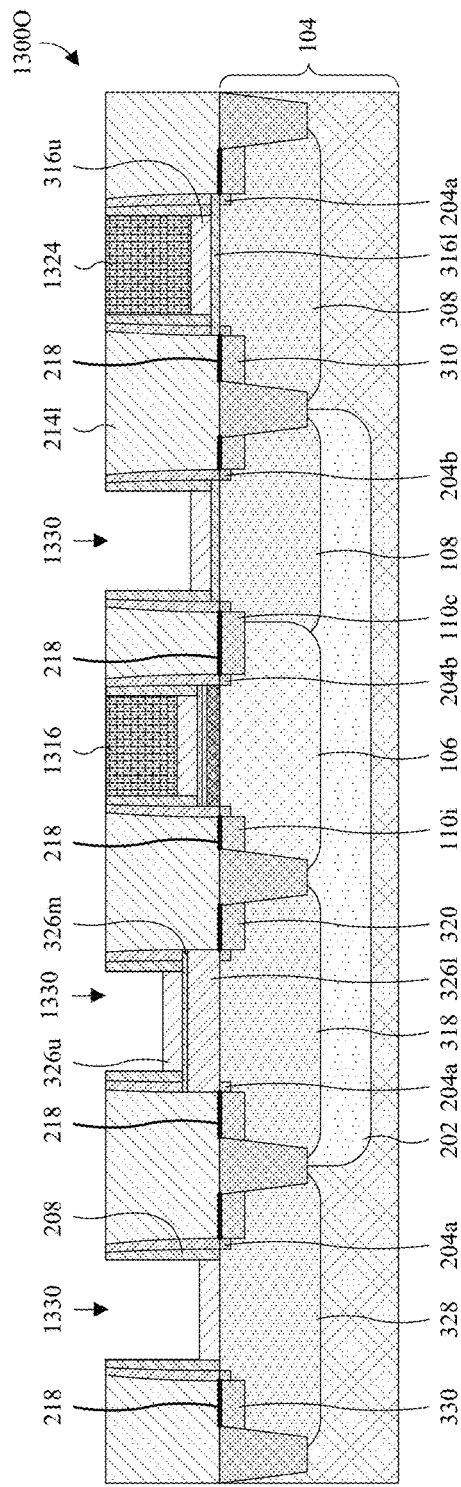
Figure 13P:
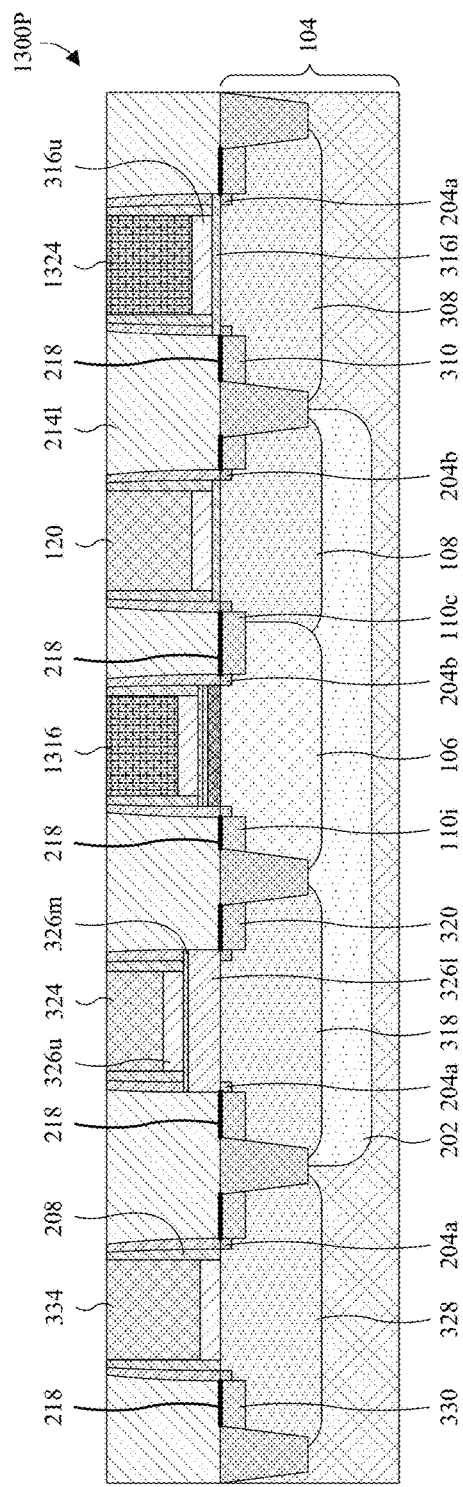
Figure 13S:
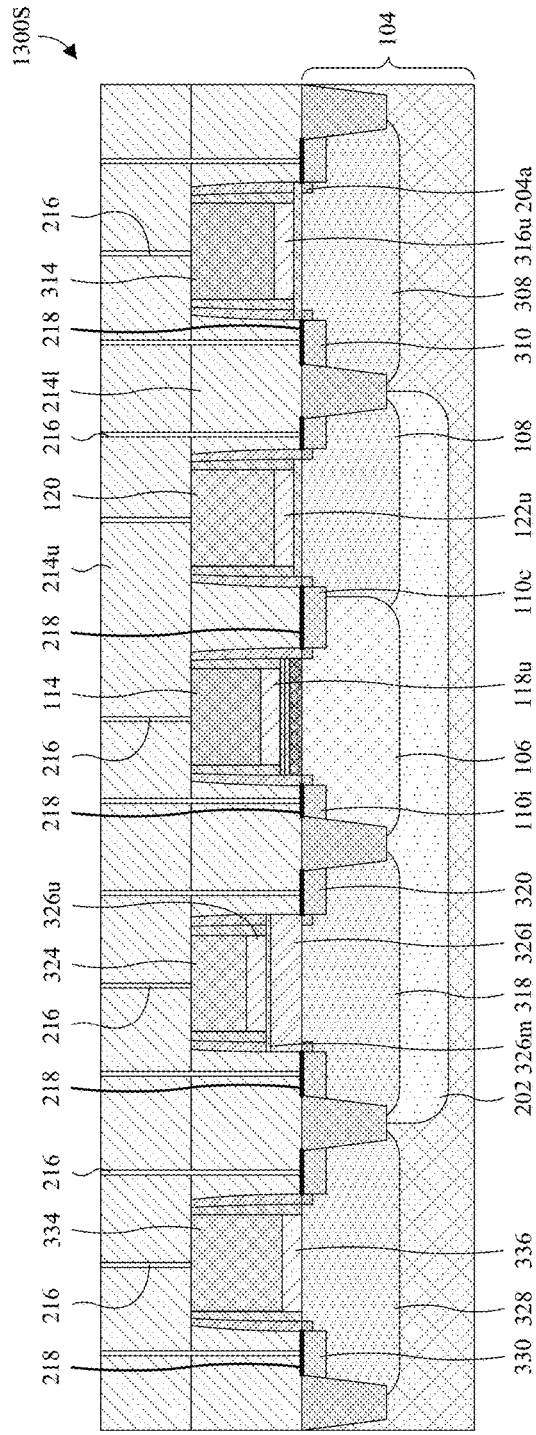

FIGS. 13A-13S form an upper select gate dielectric layer 122u (see, for example, FIG. 13C) before removing sacrificial gates in FIG. 13O. In contrast, FIGS. 14A-14I form the upper select gate dielectric layer 122u (see, for example, FIG. 14F) after removing the sacrificial gates in FIG. 14E. Therefore, in embodiments in which the upper select gate dielectric layer 122u comprises a high κ dielectric, FIGS. 13A-13S correspond to high κ "first" embodiments of the method, whereas FIGS. 14A-14I correspond to high κ "last" embodiments of the method. Additionally, FIGS. 13A-13S remove a second gate dielectric layer 1202 in FIG. 12 from a core semiconductor region 104c before forming the sacrificial gates in FIG. 13C. In contrast, FIGS. 14A-14I remove the second gate dielectric layer 1202 in FIG. 12 from the core semiconductor region 104c partially during formation of silicide pads 219 in FIG. 14C and partially during removal of the sacrificial gates in FIG. 14E. FIGS. 13A-13S may, for example, be used to form the structure of FIG. 3A, whereas FIGS. 14A-14I may, for example, be used to form the structure of FIG. 3B.

As illustrated by the cross-sectional view 400 of FIG. 4, a semiconductor substrate 104 is provided. In some embodiments, the semiconductor substrate 104 is or comprises a bulk monocrystalline silicon substrate, a SOI substrate, some other suitable semiconductor substrate(s), or any combination of the foregoing.

Also illustrated by the cross-sectional view 400 of FIG. 4, an isolation structure 206 is formed in the semiconductor substrate 104 to demarcate and electrically separate a core semiconductor region 104c, a HV semiconductor region 104h, a memory semiconductor region 104m, and an I/O semiconductor region 104i. The isolation structure 206 may be or comprise, for example, an STI structure, a DTI structure, some other suitable isolation structure(s), or any combination of the foregoing. In some embodiments, a process for forming the isolation structure 206 comprises patterning the semiconductor substrate 104 to define a trench with a layout of the isolation structure 206, and subsequently filling the trench with a dielectric material. The patterning may, for example, be performed by photolithography, some other suitable patterning process(es), or any combination of the foregoing. As used herein, a term (e.g., process) with a suffix of "(es)" may, for example, be singular or plural.

Also illustrated by the cross-sectional view 400 of FIG. 4, a sacrificial dielectric layer 402 is formed on the semiconductor substrate 104 and the isolation structure 206. The sacrificial dielectric layer 402 may be or comprise, for example, silicon oxide, some other suitable dielectric(s), or any combination of the foregoing. The sacrificial dielectric layer 402 may, for example, be formed by thermal oxidation, chemical vapor deposition (CVD), physical vapor deposition (PVD), atomic layer deposition (ALD), sputtering, some other suitable deposition process(es), or any combination of the foregoing.

As illustrated by the cross-sectional view 500 of FIG. 5, a deep well 202 is formed in the HV and memory semiconductor regions 104h, 104m, overlying a bulk semiconductor region 104b of the semiconductor substrate 104. In some embodiments, the deep well 202 and the bulk semiconductor region 104b have opposite doping types. In some embodiments, a process for forming the deep well 202 comprises selectively doping the semiconductor substrate 104. The selective doping may, for example, be performed using ion implantation with a mask in place, some other suitable selective doping process(es), or any combination of the foregoing. The mask is patterned with a layout of the deep well 202 and may be or comprise, for example, a photoresist mask, some other suitable mask(s), or any combination of the foregoing. Note that the ion implantation may, for example, be performed with the sacrificial dielectric layer 402 in place by selecting an implant energy sufficiently high for ions of the ion implantation to pass through the sacrificial dielectric layer 402.

Figure 6:
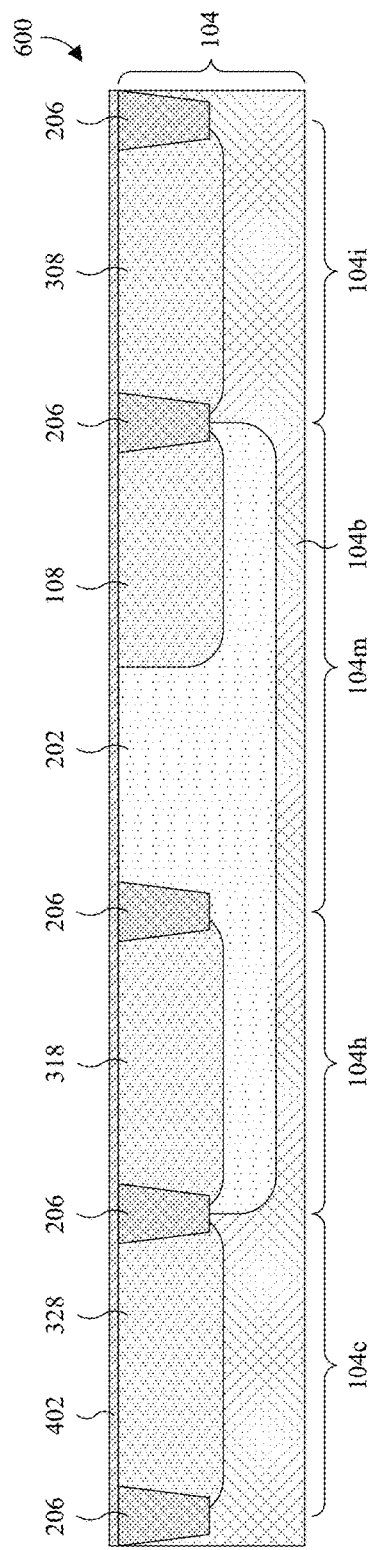

As illustrated by the cross-sectional view 600 of FIG. 6, a plurality of wells is formed in the semiconductor substrate 104. The wells comprise an I/O well 308, a HV well 318, a select gate well 108, and a core well 328 respectively formed in the I/O semiconductor region 104i, the HV semiconductor region 104h, the memory semiconductor region 104m, and the core semiconductor region 104c. The select gate well 108 and the HV well 318 overlie the deep well 202. Further, the select gate well 108 is on a first side of the memory semiconductor region 104m and is laterally spaced from a second side of the memory semiconductor region 104m that is opposite the first side. In some embodiments, the I/O well 308 has a first doping type, whereas the HV well 318, the select gate well 108, and the core well 328 have a second doping type that is opposite the first doping type. The first and second doping types may, for example, respectively be n-type and p-type, or vice versa. In some embodiments, the first doping type is the same as that of the deep well 202.

In some embodiments, a process for forming the wells comprises a series of selective doping processes. For example, a first selective doping process may form one or more n-type wells (e.g., the I/O well 308), and a second selective doping process may subsequently form one or more p-type wells (e.g., the select gate well 108, the HV well 318, and the core well 328). Each of the selective doping processes may, for example, be performed by ion implantation with a mask in place, some other suitable selective doping process(es), or any combination of the foregoing. The mask is patterned with a layout of the well(s) being formed and may be or comprise, for example, a photoresist mask, some other suitable mask(s), or any combination of the foregoing. Note that the ion implantation may, for example, be performed with the sacrificial dielectric layer 402 in place by selecting an implant energy sufficiently high for ions of the ion implantation to pass through the sacrificial dielectric layer 402.

Figure 7:
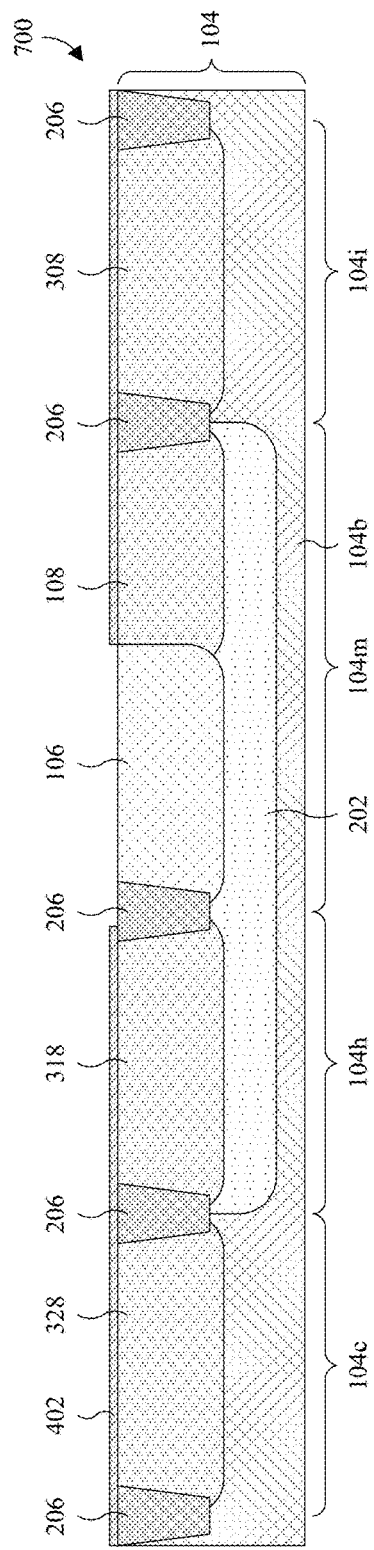

As illustrated by the cross-sectional view 700 of FIG. 7, a control gate well 106 is formed in the memory semiconductor region 104m, to the side of the select gate well 108. Further, the control gate well 106 overlies the deep well 202. The control gate well 106 has the same doping type as the select gate well 108 and, in some embodiments, has a different doping profile than the select gate well 108. For example, the select and control gate wells 108, 106 may both be p-type, and the control gate well 106 may have a different doping concentration than the select gate well 108. The control gate well 106 may, for example, be formed by ion implantation with a mask in place, some other suitable selective doping process(es), or any combination of the foregoing. The mask is patterned with a layout of the control gate well 106 and may be or comprise, for example, a photoresist mask, some other suitable mask(s), or any combination of the foregoing. Note that the ion implantation may, for example, be performed with the sacrificial dielectric layer 402 in place by selecting an implant energy sufficiently high for ions of the ion implantation to pass through the sacrificial dielectric layer 402.

Also illustrated by the cross-sectional view 700 of FIG. 7, the sacrificial dielectric layer 402 is patterned to remove the sacrificial dielectric layer 402 from the control gate well 106, while leaving the sacrificial dielectric layer 402 on the select gate well 108, the I/O well 308, the HV well 318, and the core well 328. The patterning may, for example, be performed by photolithography, some other suitable patterning process(es), or any combination of the foregoing. In some embodiments, the patterning comprises an etch into the sacrificial dielectric layer 402 through a mask (e.g., a photoresist mask) used by the selective doping process(es) performed to form the control gate well 106. Further, the patterning may, for example, be performed before or after the forming of the control gate well 106.

As illustrated by the cross-sectional view 800A of FIG. 8A, a charge trapping layer 116 is formed covering the structure of FIG. 7. The charge trapping layer 116 may be, for example, an ONO film or some other suitable charge trapping layer. In some embodiments, as illustrated by the cross-sectional view 800B of FIG. 8B, the charge trapping layer 116 comprises a lower oxide layer 116l, a middle nitride layer 116m, and an upper oxide layer 116u. The lower oxide layer 116l may, for example, have a thickness $T_l$ of about 1-3 nanometers, about 1.5-2.5 nanometers, or about 1-5 nanometers. Other values are, however, amenable for the thickness $T_l$. The middle nitride layer 116m may, for example, have a thickness $T_m$ of about 2-14 nanometers, about 6-10 nanometers, or about 7.5-8.5 nanometers. Other values are, however, amenable for the thickness $T_m$. The upper oxide layer 116u may, for example, have a thickness $T_u$ of about 2-8 nanometers, about 3-5 nanometers, or about 3.5-5.5 nanometers. Other values are, however, amenable for the thickness $T_u$. The cross-sectional view 800B of FIG. 8B may, for example, be an enlarged view of the charge trapping layer 116 taken within the circle labeled "FIG. 8B" in FIG. 8A. The charge trapping layer 116 may, for example, be formed by thermal oxidation, CVD, PVD, ALD, sputtering, some other suitable deposition process(es), or any combination of the foregoing.

Figure 9:
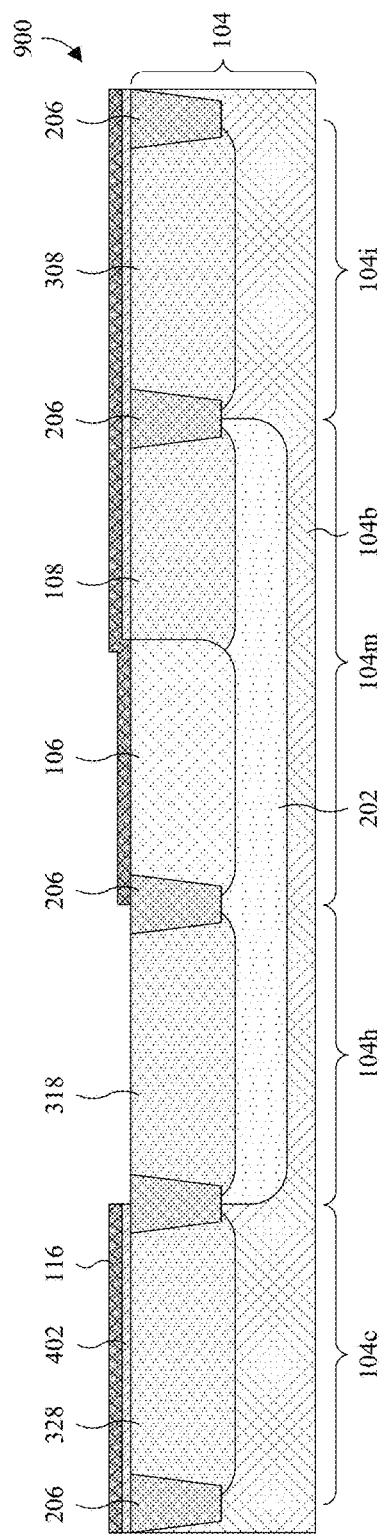

As illustrated by the cross-sectional view 900 of FIG. 9, the sacrificial dielectric layer 402 and the charge trapping layer 116 are patterned to remove the sacrificial dielectric layer 402 and the charge trapping layer 116 from the HV well 318. The patterning leaves the sacrificial dielectric layer 402 and the charge trapping layer 116 on the I/O well 308, the select gate well 108, and the core well 328, and further leaves the charge trapping layer 116 on control gate well 106. The patterning may, for example, be performed by photolithography, some other suitable patterning process(es), or any combination of the foregoing.

Figure 10:
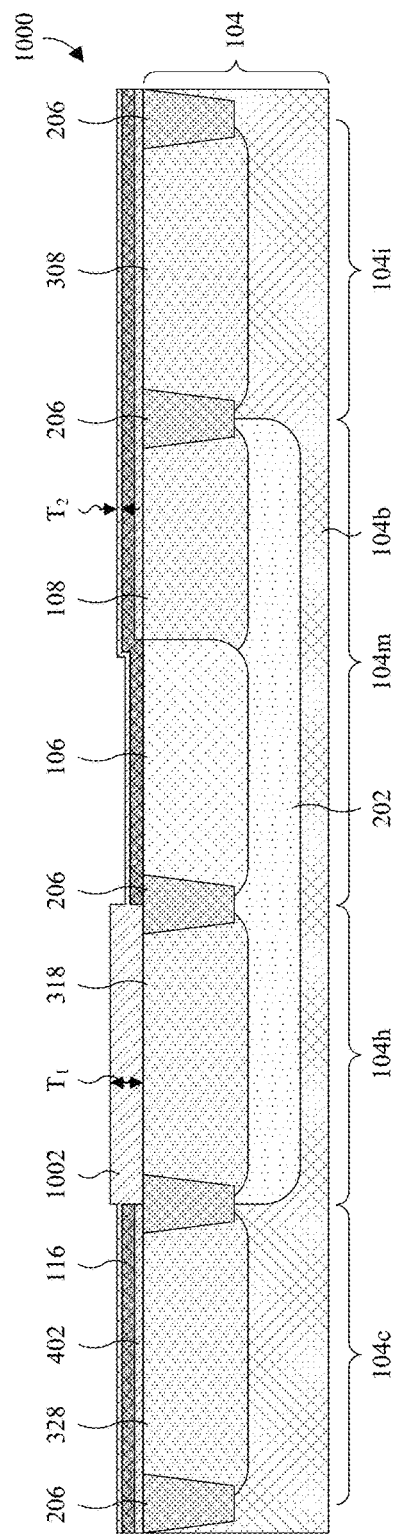

As illustrated by the cross-sectional view 1000 of FIG. 10, a first gate dielectric layer 1002 is formed covering the structure of FIG. 9. The first gate dielectric layer 1002 may be or comprise, for example, silicon oxide, some other suitable dielectric(s), or any combination of the foregoing. The first gate dielectric layer 1002 may, for example, be formed by thermal oxidation, CVD, PVD, ALD, sputtering, some other suitable deposition process(es), or any combination of the foregoing. In some embodiments, the first gate dielectric layer 1002 has a first thickness $T_1$ on the HV well 318 and a second thickness $T_2$ on the I/O well 308, the select gate well 108, the control gate well 106, and the core well 328, where the second thickness $T_2$ is less than that first thickness $T_1$. This may occur when the first gate dielectric layer 1002 is formed by thermal oxidation and the charge trapping layer 116 is an ONO film since oxide of the thermal oxidation more readily forms on semiconductor material of the semiconductor substrate 104 than on oxide of the charge trapping layer 116.

Figure 11:
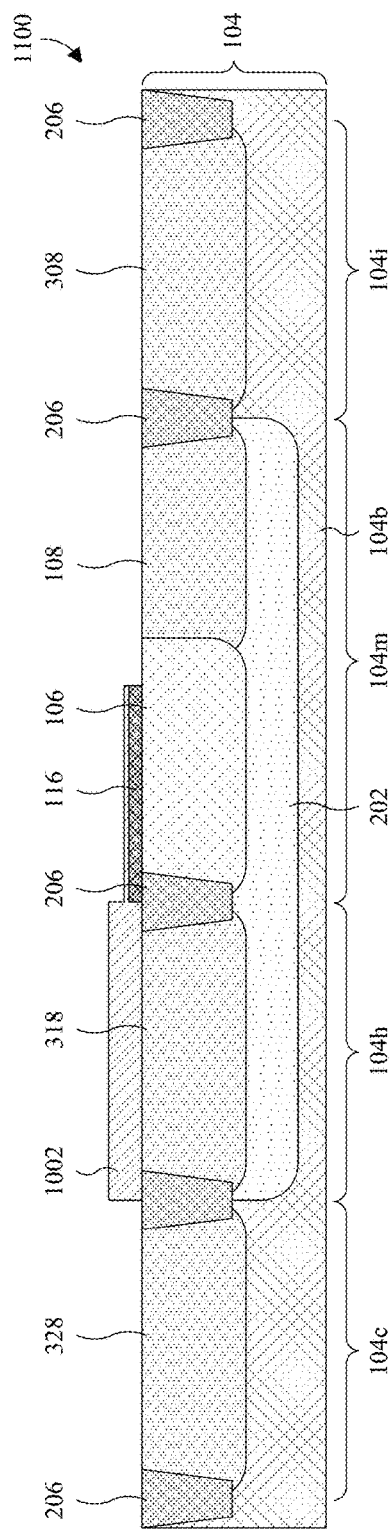

As illustrated by the cross-sectional view 1100 of FIG. 11, the first gate dielectric layer 1002 and the charge trapping layer 116 are patterned to remove the first gate dielectric layer 1002 and the charge trapping layer 116 from the I/O well 308, the select gate well 108, and the core well 328. The patterning leaves the first gate dielectric layer 1002 on the HV well 318 and the control gate well 106, and also leaves the charge trapping layer 116 on the control gate well 106. The patterning may, for example, be performed by photolithography, some other suitable patterning process(es), or any combination of the foregoing.

As illustrated by the cross-sectional view 1200 of FIG. 12, a second gate dielectric layer 1202 is formed covering the structure of FIG. 11. The second gate dielectric layer 1202 may be or comprise, for example, silicon oxide, some other suitable dielectric(s), or any combination of the foregoing. The second gate dielectric layer 1202 may, for example, be formed by thermal oxidation, CVD, PVD, ALD, sputtering, some other suitable deposition process(es), or any combination of the foregoing. In some embodiments, the second gate dielectric layer 1202 has a first thickness $T_1$ on the I/O well 308, the select gate well 108, and the core well 328, and further has a second thickness $T_2$ on the HV well 318 and the control gate well 106, where the second thickness $T_2$ is less than the first thickness $T_1$. This may occur when the second gate dielectric layer 1202 is formed by thermal oxidation and the first gate dielectric layer 1002 is oxide since oxide of the thermal oxidation more readily forms on semiconductor material of the semiconductor substrate 104 than on oxide of the first gate dielectric layer 1002.

As illustrated by the cross-sectional view 1300A of FIG. 13A, the second gate dielectric layer 1202 is patterned to remove the second gate dielectric layer 1202 from the core well 328. Further, the patterning leaves the second gate dielectric layer 1202 on the HV well 318, the control gate well 106, the select gate well 108, and the I/O well 308. The patterning may, for example, be performed by photolithography, some other suitable patterning process(es), or any combination of the foregoing.

As illustrated by the cross-sectional view 1300B of FIG. 13B, a third gate dielectric layer 1302, a sacrificial gate layer 1304, and a gate hard mask layer 1306 are formed stacked on the structure of FIG. 13A. The sacrificial gate layer 1304 overlies the third gate dielectric layer 1302, and the gate hard mask layer 1306 overlies the sacrificial gate layer 1304. The third gate dielectric layer 1302 may be or comprise, for example, hafnium oxide, silicon nitride, aluminum oxide, some other suitable high κ dielectric(s), or any combination of the foregoing. In some embodiments, the third gate dielectric layer 1302 has a thickness T of about 1-3 nanometers, about 1.5-2.5 nanometers, or about 1-5 nanometers. Other values are, however, amenable for the thickness T. The sacrificial gate layer 1304 may be or comprise, for example, n-type or p-type doped polysilicon, undoped polysilicon, some other suitable material(s), or any combination of the foregoing. The gate hard mask layer 1306 may be or comprise, for example, silicon nitride, silicon oxide, some other suitable dielectric material(s), or any combination of the foregoing. In some embodiments, a process for forming the third gate dielectric layer 1302, the sacrificial gate layer 1304, and the gate hard mask layer 1306 comprises thermal oxidation, CVD, PVD, ALD, sputtering, some other suitable deposition process(es), or any combination of the foregoing.

As illustrated by the cross-sectional view 1300C of FIG. 13C, the third gate dielectric layer 1302 (see FIG. 13B), the sacrificial gate layer 1304 (see FIG. 13B), and the gate hard mask layer 1306 (see FIG. 13B) are patterned. The patterning forms a core gate dielectric layer 336, a sacrificial core gate 1308, and a core gate hard mask 1310 stacked on the core well 328. The patterning forms an upper HV gate dielectric layer 326u, a sacrificial HV gate 1312, and a HV gate hard mask 1314 stacked on the HV well 318. The patterning forms an upper control gate dielectric layer 118u, a sacrificial control gate 1316, and a control gate hard mask 1318 stacked on the control gate well 106. The patterning forms an upper select gate dielectric layer 122u, a sacrificial select gate 1320, and a select gate hard mask 1322 stacked on the select gate well 108. The patterning forms an upper I/O gate dielectric layer 316u, a sacrificial I/O gate 1324, and an I/O gate hard mask 1326 stacked on the I/O well 308. The core gate dielectric layer 336, the upper HV gate dielectric layer 326u, the upper control gate dielectric layer 118u, the upper select gate dielectric layer 122u, and the upper I/O gate dielectric layer 316u are formed from the third gate dielectric layer 1302. The sacrificial core gate 1308, the sacrificial HV gate 1312, the sacrificial control gate 1316, the sacrificial select gate 1320, and the sacrificial I/O gate 1324 (collectively the sacrificial gates) are formed from the sacrificial gate layer 1304. The core gate hard mask 1310, the HV gate hard mask 1314, the control gate hard mask 1318, the select gate hard mask 1322, and the I/O gate hard mask 1326 (collectively the gate hard masks) are formed from the gate hard mask layer 1306.

In some embodiments, a process for patterning the third gate dielectric layer 1302, the sacrificial gate layer 1304, and the gate hard mask layer 1306 comprises patterning the gate hard mask layer 1306 to form the gate hard masks. The patterning may, for example, be performed by photolithography, some other suitable patterning process(es), or any combination of the foregoing. Thereafter, the process comprises performing an etch into the sacrificial gate layer 1304 and the third gate dielectric layer 1302 with the gate hard masks in place to transfer a pattern of the gate hard masks to the sacrificial gate layer 1304 and the third gate dielectric layer 1302. In some embodiments, the semiconductor substrate 104 and/or the second gate dielectric layer 1202 serve as an etch stop for the etch.

As illustrated by the cross-sectional view 1300D of FIG. 13D, a plurality of gate spacers 208 are formed on sidewalls of the sacrificial core, HV, control, select, and I/O gates 1308, 1312, 1316, 1320, 1324. The gate spacers 208 may be or comprise, for example, silicon nitride, silicon oxynitride, some other suitable dielectric material(s), or any combination of the foregoing. In some embodiments, a process for forming the gate spacers 208 comprises depositing a gate spacer layer covering and lining the structure of FIG. 13C, and subsequently performing an etch back into the gate spacer layer. The etch back removes horizontal segments of the gate spacer layer without removing vertical segments of the gate spacer layer. Upon completion of the etch back, the remaining vertical segments of the gate spacer correspond to the gate spacers 208.

As illustrated by the cross-sectional view 1300E of FIG. 13E, first source/drain extensions 204a are formed in the semiconductor substrate 104. For ease of illustration, only some of the first source/drain extensions 204a are labeled 204a. The first source/drain extensions 204a comprise a first pair of source/drain extensions over the core well 328, a second pair of source/drain extensions over the HV well 318, and a third pair of source/drain extensions over the I/O well 308. Further, the first source/drain extensions 204a have opposite doping types as respective wells. For example, the source/drain extensions of the first pair may have an opposite doping type as the core well 328.

In some embodiments, a process for forming the first source/drain extensions 204a comprises a series of selective doping processes. For example, a first selective doping process may form n-type source/drain extensions, and a second selective doping process may subsequently form p-type source/drain extensions. The source/drain extensions in the core and HV wells 328, 318 may, for example, be n-type, whereas the source/drain extensions in the I/O well 308 may, for example, be p-type, or vice versa. Each of the selective doping processes may, for example, be performed using ion implantation with a mask in place, some other suitable selective doping process(es), or any combination of the foregoing. The mask is patterned with a layout of the source/drain extensions being formed and may be or comprise, for example, a photoresist mask, some other suitable mask(s), or any combination of the foregoing. Note that the ion implantation may, for example, be performed with the first and second gate dielectric layers 1002, 1202 in place by selecting an implant energy sufficiently high for ions of the ion implantation to pass through the first and second gate dielectric layers 1002, 1202.

As illustrated by the cross-sectional view 1300F of FIG. 13F, the first gate dielectric layer 1002, the second gate dielectric layer 1202, and the charge trapping layer 116 are patterned. The patterning localizes the charge trapping layer 116 to directly under the upper control gate dielectric layer 118u and the gate spacers 208. The patterning forms a middle control gate dielectric layer 118m and a lower control gate dielectric layer 118l stacked between the upper control gate dielectric layer 118u and the charge trapping layer 116. The patterning forms a lower select gate dielectric layer 122l underlying the upper select gate dielectric layer 122u. The middle control gate dielectric layer 118m and the lower select gate dielectric layer 122l are formed from the second gate dielectric layer 1202, and the lower control gate dielectric layer 118l is formed from the first gate dielectric layer 1002. The patterning may, for example, be performed by photolithography, some other suitable patterning process(es), or any combination of the foregoing. For example, a photoresist mask may be formed covering the core, HV, and I/O wells 328, 318, 308, while leaving the select and control gate wells 108, 106 uncovered. An etch may then be performed into the first gate dielectric layer 1002, the second gate dielectric layer 1202, and the charge trapping layer 116 with the photoresist mask in place, and the photoresist mask may thereafter be removed. During the etch, the photoresist mask serves as a mask, along with the control gate hard mask 1318, the select gate hard mask 1322, and the gate spacers 208.

As illustrated by the cross-sectional view 1300G of FIG. 13G, second source/drain extensions 204b are formed in the semiconductor substrate 104. The second source/drain extensions 204b comprise a common source/drain extension and a pair of individual source/drain extensions. The common source/drain extension is over both the select gate well 108 and the control gate well 106, between the sacrificial select gate 1320 and the sacrificial control gate 1316. The individual source/drain extensions are respectively over the select gate well 108 and the control gate well 106, such that the sacrificial control and select gates 1316, 1320 and the common source/drain extension are between the individual source/drain extensions. The second source/drain extensions 204b have an opposite doping type as the control and select gate wells 106, 108.

In some embodiments, a process for forming the second source/drain extensions 204b comprises a selective doping process. The selective doping process may, for example, be performed using ion implantation with a mask in place, some other suitable selective doping process(es), or any combination of the foregoing. The mask is patterned with a layout of the second source/drain extensions 204b and may be or comprise, for example, a photoresist mask, some other suitable mask(s), or any combination of the foregoing. In some embodiments, the patterning of FIG. 13F and the selective doping process of FIG. 13G are performed with the same photoresist mask in place.

As illustrated by the cross-sectional view 1300H of FIG. 13H, a plurality of additional spacers 210 is formed on sidewalls of the gate spacers 208. The additional spacers 210 may be or comprise, for example, silicon nitride, silicon oxynitride, some other suitable dielectric material(s), or any combination of the foregoing. In some embodiments, a process for forming the additional spacers 210 comprises depositing a main spacer layer covering and lining the structure of FIG. 13G, and subsequently performing an etch back into the main spacer layer. The etch back removes horizontal segments of the main spacer layer without removing vertical segments of the main spacer layer. The remaining vertical segments of the main spacer layer correspond to the additional spacers 210.

As illustrated by the cross-sectional view 1300I of FIG. 13I, source/drains are formed in the semiconductor substrate 104. The source/drains comprise a pair of core source/drains 330, a pair of HV source/drains 320, a pair of I/O source/drains 310, a common memory source/drain 110c, and a pair of individual memory source/drains 110i. The core source/drains 330, the HV source/drains 320, and the I/O source/drains 310 are respectively formed on the core well 328, the HV well 318, and the I/O well 308. The core source/drains 330, the HV source/drains 320, and the I/O source/drains 310 each adjoin a respective one of the first source/drain extensions 204a and have the same doping type as, but a higher doping concentration than, the respective source/drain extension. The common memory source/drain 110c is on the select and control gate wells 108, 106, between the sacrificial select and control gates 1316, 1320. The individual memory source/drains 110i are respectively on the select and control gate wells 108, 106, such that the sacrificial control and select gates 1316, 1320 and the common memory source/drain 110c are between the individual memory source/drains 110i. The common and individual memory source/drains 110c, 110i each adjoin a respective one of the second source/drain extensions 204b and have the same doping type as, but a higher doping concentration than, the respective source/drain extension.

In some embodiments, a process for forming the source/drains comprises a series of selective doping processes. For example, a first selective doping process may form n-type source/drains, and a second selective doping process may subsequently form p-type source/drains. The core source/drains 330, the HV source/drains 320, the common memory source/drain 110c, and the individual memory source/drains 110i may, for example, be n-type, whereas the I/O source/drains 310 may, for example, be p-type. Each of the selective doping processes may, for example, be performed using ion implantation with a mask in place, some other suitable selective doping process(es), or any combination of the foregoing. The mask is patterned with a layout of the source/drains being formed and may be or comprise, for example, a photoresist mask, some other suitable mask(s), or any combination of the foregoing. Note that the ion implantation may, for example, be performed with the first and second gate dielectric layers 1002, 1202 in place by selecting an implant energy sufficiently high for ions of the ion implantation to pass through the first and second gate dielectric layers 1002, 1202.

As illustrated by the cross-sectional view 1300J of FIG. 13J, silicide pads 218 are formed on the core source/drains 330, the HV source/drains 320, the I/O source/drains 310, the common memory source/drain 110c, and the individual memory source/drains 110i (collectively the source/drains). The silicide pads 218 may be or comprise, for example, nickel silicide, some other suitable silicide(s), or any combination of the foregoing. In some embodiments, a process for forming the silicide pads 218 comprises: 1) forming a protective dielectric layer covering and lining the structure of FIG. 13I; 2) patterning the protective dielectric layer to expose the source/drains; 3) performing a salicide process with the protective dielectric layer in place; and 4) removing the protective dielectric layer. In some embodiments, the removing is performed by an etch or some other suitable removal process(es). The etch preferentially removes material (e.g., oxide) of the protective dielectric layer relative to other material (e.g., nitride or silicide) underlying and/or neighboring the protective dielectric layer.

Also illustrated by the cross-sectional view 1300J of FIG. 13J, the first and second gate dielectric layers 1002, 1202

(see FIG. 13I) are patterned. The patterning forms a lower HV gate dielectric layer 326*l* and a middle HV gate dielectric layer 326*m* stacked under the upper HV gate dielectric layer 326*u*. The patterning further forms a lower I/O gate dielectric layer 316*l* underlying the upper I/O gate dielectric layer 316*u*. The lower HV gate dielectric layer 326*l* is formed from the first gate dielectric layer 1002, and the middle HV gate dielectric layer 326*m* and the lower I/O gate dielectric layer 316*l* are formed from the second gate dielectric layer 1202. The patterning may, for example, be performed by an etch or some other suitable patterning process(es). In some embodiments, the etch is the same etch that removes the protective dielectric layer used while forming the silicide pads 218.

As illustrated by the cross-sectional view 1300K of FIG. 13K, an etch back layer 1328 is formed covering the structure of FIG. 13J. In some embodiments, the etch back layer 1328 is a flowable, self-leveling material, such that gravity causes a top surface of the etch back layer 1328 to flatten. In some embodiments, the etch back layer 1328 is an organic material, an antireflective coating (ARC), some other suitable material(s), or any combination of the foregoing. The etch back layer 1328 may be formed by, for example, CVD, PVD, some other suitable deposition process(es), or any combination of the foregoing.

As illustrated by the cross-sectional view 1300L of FIG. 13L, an etch is performed to etch back the etch back layer 1328, and to further remove the core gate hard mask 1310 (see FIG. 13K), the HV gate hard mask 1314 (see FIG. 13K), the control gate hard mask 1318 (see FIG. 13K), the select gate hard mask 1322 (see FIG. 13K), and the I/O gate hard mask 1326 (see FIG. 13K). For brevity, the core gate hard mask 1310, the HV gate hard mask 1314, the control gate hard mask 1318, the select gate hard mask 1322, and the I/O gate hard mask 1326 are collectively referred to as "the hard masks". The etch is performed with an etchant that has the same or substantially the same etch rate for the etch back layer 1328 as for the hard masks. As such, a top surface of the etch back layer 1328 and top surfaces of the hard masks are etched back together once the etch back layer 1328 is sufficiently etched to expose the hard masks. Further, the etchant has a low etch rate for the sacrificial core gate 1308, the sacrificial HV gate 1312, the sacrificial control gate 1316, the sacrificial select gate 1320, and the sacrificial I/O gate 1324 relative to the etch back layer 1328 and the hard masks.

As illustrated by the cross-sectional view 1300M of FIG. 13M, the etch back layer 1328 (see FIG. 13L) is removed, and a lower ILD layer 214*l* is formed in place of the etch back layer 1328. The lower ILD layer 214*l* may be or comprise, for example, oxide, a low κ dielectric, some other suitable dielectric(s), or any combination of the foregoing. In some embodiments, a process for removing the etch back layer 1328 comprises an etch or some other suitable removal process(es). In some embodiments, a process for forming the lower ILD layer 214*l* comprises depositing the lower ILD layer 214*l* by CVD, PVD, ALD, sputtering, some other suitable deposition process(es), or any combination of the foregoing.

As illustrated by the cross-sectional view 1300N of FIG. 13N, a planarization is performed into the lower ILD layer 214*l* to coplanarize a top surface of the lower ILD layer 214*l* with top surfaces respectively of the sacrificial core gate 1308, the sacrificial HV gate 1312, the sacrificial control gate 1316, the sacrificial select gate 1320, and the sacrificial I/O gate 1324. The planarization may, for example, be performed by a CMP or some other suitable planarization process(es).

As illustrated by the cross-sectional view 1300O of FIG. 13O, first sacrificial gates are removed. The first sacrificial gates include the sacrificial control gate 1316, but not the sacrificial select gate 1320 (see FIG. 13N), in some embodiments in which the sacrificial control and select gates 1316, 1320 correspond to a p-channel memory device. The first sacrificial gates include the sacrificial select gate 1320, but not the sacrificial control gate 1316, in some embodiments in which the sacrificial control and select gates 1316, 1320 correspond to an n-channel memory device. Further, the first sacrificial gates include sacrificial gates that correspond to n-channel semiconductor devices and that neighbor the sacrificial control and select gates 1316, 1320. In some embodiments, the first sacrificial gates include the sacrificial core gate 1308 (see FIG. 13N), the sacrificial HV gate 1312 (see FIG. 13N), and the sacrificial select gate 1320. The removal results in first gate openings 1330 in place of the removed sacrificial gate electrodes. The removal may, for example, be performed by a selective etch, some other suitable removal process(es), or any combination of the foregoing. In some embodiments, the selective etch comprises: 1) forming a mask on the structure of FIG. 13N; 2) performing an etch into sacrificial gates uncovered by the mask; and 3) subsequently removing the mask. The mask has a layout of sacrificial gates to be removed and may be or comprise, for example, a photoresist mask, some other suitable mask(s), or any combination of the foregoing.

As illustrated by the cross-sectional view 1300P of FIG. 13P, metal gate electrodes with n-type work functions (hereafter n-type metal gate electrodes) are formed in the first gate openings 1330 (see FIG. 13O). The n-type work function may, for example, be: 1) a work function within about 0.1 eV, 0.2 eV, or 0.4 eV of a work function for n-type polycrystalline silicon; 2) a work function less than about 4.0 eV, 4.2 eV, or 4.4 eV; 3) a work function between about 3.5-4.4 eV, 4.0-4.4 eV, or 3.8-4.5 eV; 4) some other suitable n-type work function; or 5) any combination of the foregoing. Further, the n-type metal gate electrodes may be or comprise, for example, hafnium, zirconium, titanium, tantalum, aluminum, some other suitable n-type work function metal(s), or any combination of the foregoing. In some embodiments, the n-type metal gate electrodes comprise a core gate electrode 334, a HV gate electrode 324, and a select gate electrode 120. The core gate electrode 334, the HV gate electrode 324, and the select gate electrode 120 fill the first gate openings 1330 respectively on the core well 328, the HV well 318, and the select gate well 108.

In some embodiments, a process for forming the n-type metal gate electrodes comprises forming a conductive layer covering the structure of FIG. 13O, and further filling the first gate openings 1330. The conductive layer is or comprises metal with an n-type work function and may be formed by, for example, by CVD, PVD, electroless plating, electroplating, some other suitable growth or deposition process(es), or any combination of the foregoing. A planarization is then performed into the conductive layer until the lower ILD layer 214*l* is reached. The planarization may, for example, be performed by a CMP or some other suitable planarization process(es).

As illustrated by the cross-sectional view 1300Q of FIG. 13Q, second sacrificial gates are removed. The second sacrificial gates include the sacrificial control gate 1316 (see FIG. 13N), but not the sacrificial select gate 1320 (see FIG. 13N), in some embodiments in which the sacrificial control and select gates 1316, 1320 correspond to an n-channel memory device. The second sacrificial gates include the sacrificial select gate 1320, but not the sacrificial control gate 1316, in some embodiments in which the sacrificial control and select gates 1316, 1320 correspond to a p-channel memory device. Further, the second sacrificial gates include sacrificial gates that correspond to p-channel semiconductor devices and that neighbor the sacrificial control and select gates 1316, 1320. In some embodiments, the second sacrificial gates include the sacrificial I/O gate 1324 (see FIG. 13N) and the sacrificial control gate 1316. The removal results in second gate openings 1332 in place of the removed sacrificial gate electrodes and may, for example, be performed as described with regard to FIG. 13O.

As illustrated by the cross-sectional view 1300R of FIG. 13R, metal gate electrodes with p-type work functions (hereafter p-type metal gate electrodes) are formed in the second gate openings 1332 (see FIG. 13Q). The p-type work function may, for example, be: 1) a work function within about 0.1 eV, 0.2 eV, or 0.4 eV of a work function for p-type polycrystalline silicon; 2) a work function greater than about 4.8 eV, 5.0 eV, or 5.2 eV; 3) a work function between about 4.8-5.2 eV, 5.0-5.4 eV, or 4.6-5.6 eV; 4) some other suitable p-type work functions; or 5) any combination of the foregoing. The p-type metal gate electrodes may be, for example, ruthenium, palladium, platinum, cobalt, nickel, titanium aluminum nitride, tungsten carbon nitride, some other suitable p-type work function metal(s), or any combination of the foregoing. In some embodiments, the p-type metal gate electrodes comprise a control gate electrode 114 and an I/O gate electrode 314. The control gate electrode 114 and the I/O gate electrode 314 fill the second gate openings 1332 respectively on the control gate well 106 and the I/O well 308.

In some embodiments, a process for forming the p-type metal gate electrodes comprises forming a conductive layer covering the structure of FIG. 13Q, and further filling the second gate openings 1332. The conductive layer is or comprises metal with a p-type work function and may be formed by, for example, by CVD, PVD, electroless plating, electroplating, some other suitable growth or deposition process(es), or any combination of the foregoing. A planarization is then performed into the conductive layer until the lower ILD layer 214*l* is reached. The planarization may, for example, be performed by a CMP or some other suitable planarization process(es).

As illustrated by the cross-sectional view 1300S of FIG. 13S, an upper ILD layer 214*u* is formed covering the structure of FIG. 13R and with a top surface that is planar or substantially planar. The upper ILD layer 214*u* may be or comprise, for example, oxide, a low κ dielectric, some other suitable dielectric(s), or any combination of the foregoing. Further, the upper ILD layer 214*u* may, for example, be formed depositing the upper ILD layer 214*u*, and subsequently performing a planarization into the top surface of the upper ILD layer 214*u*. The deposition may, for example, be performed by CVD, PVD, sputtering, some other suitable deposition process(es), or any combination of the foregoing. The planarization may, for example, be performed by a CMP or some other suitable planarization process(es).

Also illustrated by the cross-sectional view 1300S of FIG. 13S, contact vias 216 are formed extending through the upper ILD layer 214*u* and the lower ILD layer 214*l* to the silicide pads 218, the control gate electrode 114, the select gate electrode 120, the core gate electrode 334, the HV gate electrode 324, the I/O gate electrode 314, or any combination of the foregoing. The contact vias 216 may, for example, be formed by patterning the upper ILD layer 214*u* and the lower ILD layer 214*l* to define a plurality of via openings with a layout of the contact vias 216, and subsequently filling the via openings with metal, some other suitable conductive material(s), or any combination of the foregoing.

As noted above, FIGS. 13A-13S are alternatives to FIGS. 14A-14I, such that the method may proceed from the acts of FIG. 12 to either: 1) the acts of FIGS. 13A-13S; or 2) the acts of FIGS. 14A-14I. FIGS. 13A-13S describe first embodiments of the method that may, for example, be used to form the structure of FIG. 3A. FIGS. 14A-14I describe second embodiments of the method that may, for example, be used to form the structure of FIG. 3B. The second embodiments are variants of the first embodiments in which the patterning at FIG. 13A and the third gate dielectric layer 1302 at FIG. 13B are omitted. Further, the core gate dielectric layer 336 and the upper HV, control, select, and I/O gate dielectric layers 326*u*, 118*u*, 122*u*, 316*u* are formed after removal of sacrificial gates at FIGS. 13O and 13Q.

Figure 14A:
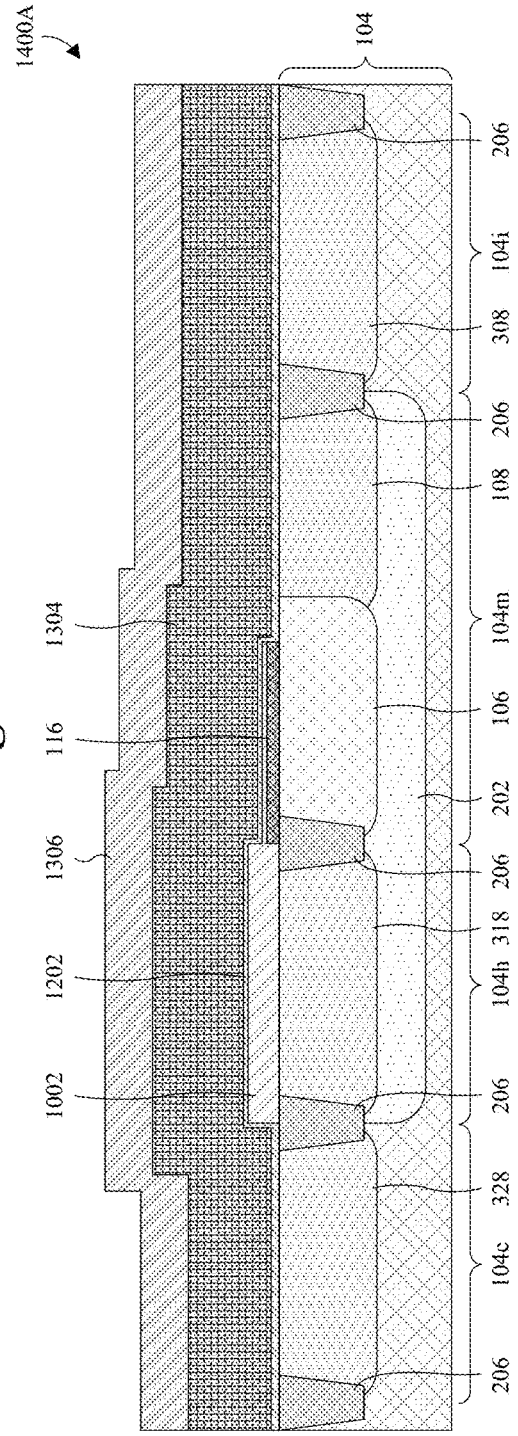

As illustrated by the cross-sectional view 1400A of FIG. 14A, the sacrificial gate layer 1304 and the gate hard mask layer 1306 are formed stacked on the structure of FIG. 12. The sacrificial gate layer 1304 and the gate hard mask layer 1306 may, for example, be formed as described with regard to FIG. 13B.

As illustrated by the cross-sectional view 1400B of FIG. 14B, the first and second gate dielectric layers 1002, 1202, the charge trapping layer 116, the sacrificial gate layer 1304 (see FIG. 14A), and the gate hard mask layer 1306 (see FIG. 14A) are patterned. Further, the first and second source/drain extensions 204*a*, 204*b*, the core, HV, and I/O source/drains 330, 320, 310, and the common and individual memory source/drains 110*c*, 110*i* are formed. Further yet, the gate spacers 208 and the additional spacers 210 are formed. The patterning and the forming may, for example, be performed by the acts illustrated and described with regard to FIGS. 13C-13I.

As illustrated by the cross-sectional view 1400C of FIG. 14C, the silicide pads 218 are formed on the core, HV, and I/O source/drains 330, 320, 310 and the common and individual memory source/drains 110*c*, 110*i* (collectively the source/drains). The silicide pads 218 may, for example, be formed as described with regard to FIG. 13J. In some embodiments, a process for forming the silicide pads 218 comprises: 1) forming a protective dielectric layer covering and lining the structure of FIG. 14B; 2) patterning the protective dielectric layer to expose the source/drains; 3) performing a salicide process with the protective dielectric layer in place; and 4) removing the protective dielectric layer. In some embodiments, the removing is performed by an etch or some other suitable removal process(es).

Also illustrated by the cross-sectional view 1400C of FIG. 14C, the first and second gate dielectric layers 1002, 1202 (see FIG. 14B) are patterned. The patterning forms the lower HV gate dielectric layer 326*l* and the middle HV gate dielectric layer 326*m* stacked under the sacrificial HV gate 1312. The patterning further forms the lower I/O gate dielectric layer 316*l* underlying the sacrificial I/O gate 1324, and a dummy gate dielectric layer 1402 underlying the sacrificial core gate 1308. The patterning may, for example, be performed by an etch or some other suitable patterning process(es). In some embodiments, the etch is the same etch that removes the protective dielectric layer used while forming the silicide pads 218.

As illustrated by the cross-sectional view 1400D of FIG. 14D, the core, HV, control, select, and I/O gate hard masks 1310, 1314, 1318, 1322, 1326 (see FIG. 14C) are removed.

Further, top surfaces respectively of the sacrificial core, HV, control, select, I/O gates 1308, 1312, 1316, 1320, 1324 are coplanarized. The removal and the coplanarization may, for example, be performed by the acts illustrated and described with regard to FIGS. 13K-13N.

As illustrated by the cross-sectional view 1400E of FIG. 14E, first sacrificial gates are removed. The first sacrificial gates include the sacrificial control gate 1316, but not the sacrificial select gate 1320 (see FIG. 14D), in some embodiments in which the sacrificial control and select gates 1316, 1320 correspond to a p-channel memory device. The first sacrificial gates include the sacrificial select gate 1320, but not the sacrificial control gate 1316, in some embodiments in which the sacrificial control and select gates 1316, 1320 correspond to an n-channel memory device. Further, the first sacrificial gates include sacrificial gates that correspond to n-channel semiconductor devices and that neighbor the sacrificial control and select gates 1316, 1320. For example, the first sacrificial gates may further include the sacrificial core and HV gates 1308, 1312 (see FIG. 14D). In embodiments in which the sacrificial core gate 1308 is removed, a portion of the dummy gate dielectric layer 1402 (see FIG. 14D) underlying the sacrificial core gate 1308 is also removed, thereby resulting in a residual dielectric layer 338. The removal results in the first gate openings 1330 in place of the removed sacrificial gates and may, for example, be performed as described with regard to FIG. 13O.

As illustrated by the cross-sectional view 1400F of FIG. 14F, n-type metal gate electrodes and gate dielectric layers are formed in the first gate openings 1330 (see FIG. 14D). The gate dielectric layers respectively cup undersides of the n-type metal gate electrodes and may be or comprise, for example, hafnium oxide, aluminum oxide, silicon nitride, some other suitable high κ dielectric(s), or any combination of the foregoing. The n-type metal gate electrodes may, for example, be as described with regard to FIG. 13P. In some embodiments, the n-type metal gate electrodes comprise the core, HV, and select gate electrodes 334, 324, 120, whereas the gate dielectric layers comprise the core gate dielectric layer 336, the upper HV gate dielectric layer 326u, and the upper select gate dielectric layer 122u.

In some embodiments, a process for forming the n-type metal gate electrodes and the gate dielectric layers comprises forming a third gate dielectric layer covering and lining the structure of FIG. 14E, and subsequently forming a conductive layer over the third gate dielectric layer. The conductive layer may be formed by, for example, by CVD, PVD, electroless plating, electroplating, some other suitable growth or deposition process(es), or any combination of the foregoing. The third gate dielectric layer may be formed by, for example, CVD, PVD, sputtering, some other suitable deposition process(es), or any combination of the foregoing. A planarization is then performed into the conductive layer and the third gate dielectric layer until the lower ILD layer 214l is reached. The planarization may, for example, be performed by a CMP or some other suitable planarization process(es).

As illustrated by the cross-sectional view 1400G of FIG. 14G, second sacrificial gates are removed. The second sacrificial gates include the sacrificial control gate 1316 (see FIG. 14D), but not the sacrificial select gate 1320 (see FIG. 14D), in some embodiments in which the sacrificial control and select gates 1316, 1320 correspond to an n-channel memory device. The second sacrificial gates include the sacrificial select gate 1320, but not the sacrificial control gate 1316, in some embodiments in which the sacrificial control and select gates 1316, 1320 correspond to a p-channel memory device. Further, the second sacrificial gates include sacrificial gates that correspond to p-channel semiconductor devices and that neighbor the sacrificial control and select gates 1316, 1320. For example, the second sacrificial gates may further include the sacrificial I/O gate 1324 (see FIG. 14D). The removal results in the second gate openings 1332 in place of the removed sacrificial gates and may, for example, be performed as described with regard to FIG. 13Q.

As illustrated by the cross-sectional view 1400H of FIG. 14H, p-type metal gate electrodes and gate dielectric layers are formed in the second gate openings 1332 (see FIG. 14G). The gate dielectric layers respectively cup undersides of the p-type metal gate electrodes and may be or comprise, for example, hafnium oxide, aluminum oxide, silicon nitride, some other suitable high κ dielectric(s), or any combination of the foregoing. The p-type metal gate electrodes may, for example, be as described with regard to FIG. 13R. In some embodiments, the p-type metal gate electrodes comprise the I/O and control gate electrodes 314, 114, whereas the gate dielectric layers comprise the upper I/O gate dielectric layer 316u and the upper control gate dielectric layer 118u.

In some embodiments, a process for forming the p-type metal gate electrodes and the additional gate dielectric layers comprises forming a fourth gate dielectric layer covering and lining the structure of FIG. 14G, and subsequently forming a conductive layer over the fourth gate dielectric layer. The conductive layer may be formed by, for example, by CVD, PVD, electroless plating, electroplating, some other suitable growth or deposition process(es), or any combination of the foregoing. The fourth gate dielectric layer may be formed by, for example, CVD, PVD, sputtering, some other suitable deposition process(es), or any combination of the foregoing. A planarization is then performed into the conductive layer and the fourth gate dielectric layer until the lower ILD layer 214l is reached. The planarization may, for example, be performed by a CMP or some other suitable planarization process(es).

As illustrated by the cross-sectional view 1400I of FIG. 14I, an upper ILD layer 214u is formed covering the structure of FIG. 14H and with a top surface that is planar or substantially planar. Further, contact vias 216 are formed extending through the upper ILD layer 214u and the lower ILD layer 214l to the silicide pads 218, the control gate electrode 114, the select gate electrode 120, the core gate electrode 334, the HV gate electrode 324, the I/O gate electrode 314, or any combination of the foregoing. The upper ILD layer 214u and the contact vias 216 may, for example, be formed as described with regard to FIG. 13S.

As noted above, the sacrificial gates (e.g., the sacrificial control gate 1316 at FIGS. 13C and 14B) are replaced with gate electrodes (e.g., the control gate electrode 114) after forming source/drains (e.g., the common memory source/drains 110c). Therefore, the doping process used to form the source/drains does not affect the work functions of the gate electrodes. Further, because the sacrificial gates are replaced with the gate electrodes, the sacrificial gates may be undoped polysilicon or some other suitable material that does not depend on a doping process. Therefore, doping profiles in the semiconductor substrate 104 (e.g., doping profiles of the control and select gate wells 106, 108) are not subject to damage from a doping process while forming the sacrificial gates. Further, because the gate electrodes are metal, the doping profiles in the semiconductor substrate 104 are not subject to damage from a doping process while forming the gate electrodes. Further, because the gate electrodes are metal and formed on high κ dielectrics (e.g., the upper control gate dielectric layer 118u), the gate electrodes may be scaled for advanced process nodes, such as, for example, 28 nm, 20 nm, and smaller process nodes.

While FIGS. 4-7, 8A, 8B, 9-12, 13A-13S, and 14A-14I illustrate the replacement of the sacrificial select gate 1320 (see, e.g., FIG. 13N) with metal, it is to be appreciated that the sacrificial select gate 1320 may not be replaced in other embodiments. In some of such other embodiments, the sacrificial select gate 1320 is formed from a conductive material and persists into a final integrated circuit. The conductive material may, for example, be or comprise n-type or p-type polysilicon or some other suitable conductive material. In some embodiments where the control gate electrode 120 (see, e.g., FIG. 13R) is or comprises a metal with a work function of a first doping type (e.g., n-type or p-type), the sacrificial select gate 1320 is formed from doped polysilicon with the first doping type or some other suitable material with a work function of the first doping type. In other embodiments where the control gate electrode 120 is or comprises metal with a work function of a first doping type (e.g., n-type or p-type), the sacrificial select gate 1320 is formed from doped polysilicon with a second doping type or some other suitable material with a work function of the second doping type, where the second doping type is opposite the first doping type.

While FIGS. 4-7, 8A, 8B, 9-12, 13A-13S, and 14A-14I illustrate the replacement of the sacrificial select gate 1320 (see, e.g., FIG. 13N) and the sacrificial control gate 1316 (see, e.g., FIG. 13N) with different metals, the sacrificial select gate 1320 and the sacrificial control gate 1316 may be replaced with the same metal in other embodiments. For example, where the sacrificial control gate 1316 is replaced with metal having an n-type work function, the sacrificial select gate 1320 may also be replaced with the metal having an n-type work function. As another example, where the sacrificial control gate 1316 is replaced with metal having a p-type work function, the sacrificial select gate 1320 may also be replaced with the metal having a p-type work function.

Figure 15:
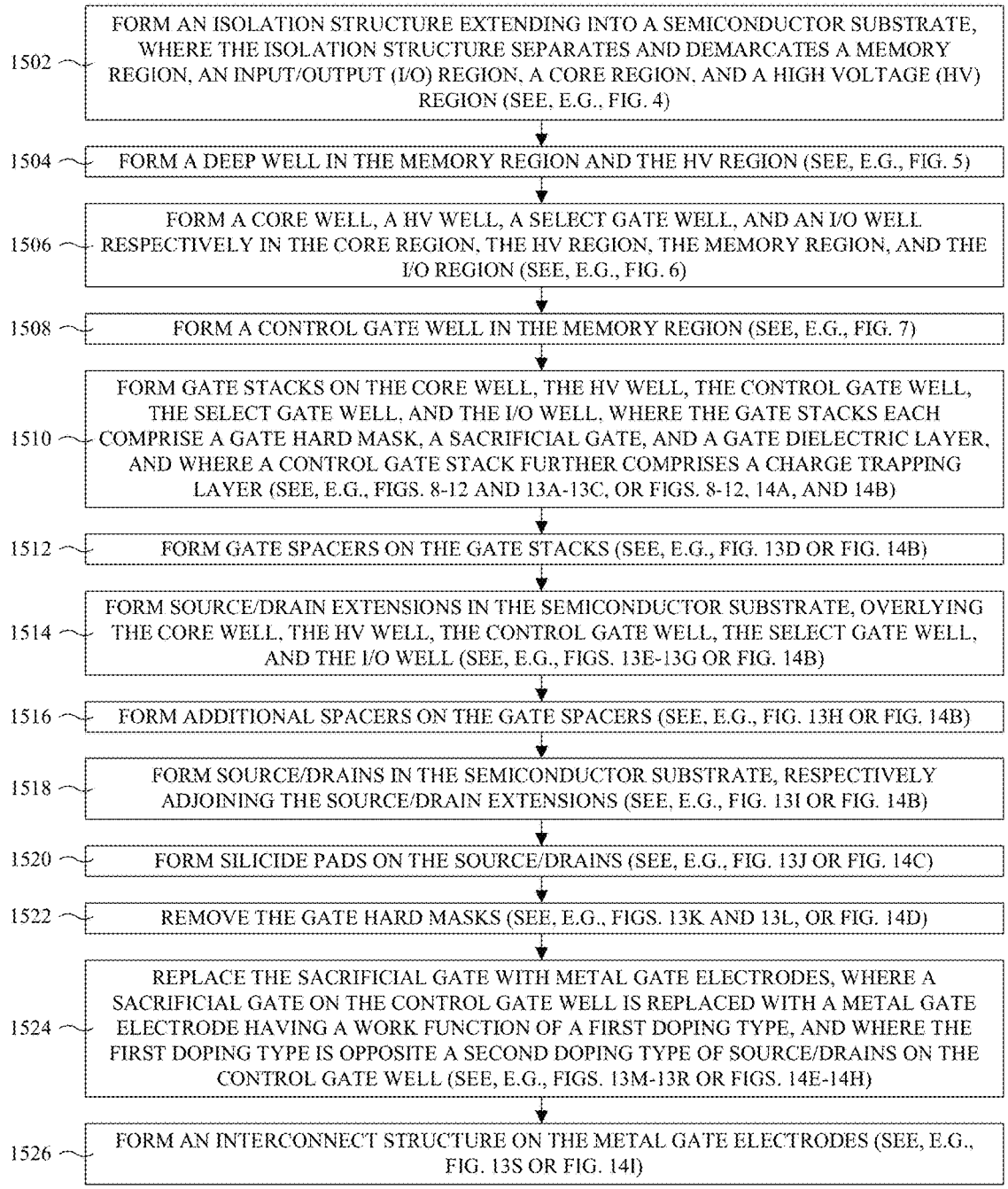
FIG. 15 illustrates a flowchart of some embodiments of the method of FIGS. 4-7, 8A, 8B, 9-12, 13A-13S, and 14A-14I.

With reference to FIG. 15, a flowchart 1500 of some embodiments of the method of FIGS. 4-7, 8A, 8B, 9-12, 13A-13S, and 14A-14I is provided. The method may, for example, be employed to form a memory cell with a large operation window and a high erase speed.

At 1502, an isolation structure is formed extending into a semiconductor substrate. The isolation structure separates and demarcates a memory region, an I/O region, a core region, and a HV region. See, for example, FIG. 4.

At 1504, a deep well is formed in the memory region and the HV region. See, for example, FIG. 5.

At 1506, a core well, a HV well, a select gate well, and an I/O well are formed respectively in the core region, the HV region, the memory region, and the I/O region. See, for example, FIG. 6.

At 1508, a control gate well is formed in the memory region, adjacent to the select gate well. See, for example, FIG. 7.

At 1510, gate stacks are formed respectively on the core well, the HV well, the control gate well, the select gate well, and the I/O well. Each of the gate stacks comprises a gate hard mask, a sacrificial gate, and a gate dielectric layer. A control gate stack of the gate stacks further comprises a charge trapping layer. See, for example, FIGS. 8-12 and 13A-13C, or FIGS. 8-12, 14A, and 14B.

At 1512, gate spacers are formed on sidewalls of the gate stacks. See, for example, FIG. 13D or FIG. 14B.

At 1514, source/drain extensions are formed in the semiconductor substrate, respectively overlying the core well, the HV well, the control gate well, the select gate well, and the I/O well. See, for example, FIGS. 13E-13G or FIG. 14B.

At 1516, additional spacers are formed on sidewalls of the gate spacers. See, for example, FIG. 13H or FIG. 14B.

At 1518, source/drains are formed in the semiconductor substrate, respectively adjoining the source/drain extensions. See, for example, FIG. 13I or FIG. 14B.

At 1520, silicide pads are formed on the source/drains. See, for example, FIG. 13J or FIG. 14C.

At 1522, the gate hard masks of the gate stacks are removed. See, for example, FIGS. 13K and 13L, or FIG. 14D.

At 1524, the sacrificial gate electrodes are replaced with metal gate electrodes. A sacrificial gate electrode on the control gate well is replaced with a metal control gate electrode having a work function of a first doping type, where the first doping type is opposite a second doping type of source/drains on the control gate well. See, for example, FIGS. 13M-13R or FIGS. 14E-14H.

In embodiments in which the memory cell is an n-channel memory cell, the source/drains on the control gate well are n-type and the metal control gate electrode has a p-type work function. By using metal with a p-type work function for the metal control gate electrode, the metal control gate electrode has a high work function. The high work function leads to difficult electron back gate injection. The difficult electron back gate injection enables the use of a high erase voltage to achieve a high erase speed. Further, the difficult electron back gate injection leads to a low erase saturation level and a large operation window. The operation window is the voltage range from the control gate threshold voltage in a programmed state to the control gate threshold voltage in an erased state, and a large operation window renders the memory cell more resilient to process variation and noise during read operations. Additionally, the metal of the control and select gate electrodes, together with high κ gate control and select dielectrics, allows the memory cell to be scaled for advanced process nodes, such as, for example, 28 nm, 20 nm, and smaller process nodes.

At 1526, an interconnect structure is formed on the metal gate electrodes. See, for example, FIG. 13S or FIG. 14I.

While the flowchart 1500 of FIG. 15 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides an IC including: a semiconductor substrate; and a memory cell on the semiconductor substrate, wherein the memory cell includes a control gate electrode, a select gate electrode, a charge trapping layer, and a common source/drain, wherein the common source/drain is in the semiconductor substrate and has a first doping type, wherein the control gate electrode and the select gate electrode overlie the semiconductor substrate and are respectively on opposite sides of the common source/drain, wherein the control gate electrode overlies the charge trapping layer and includes a metal with a work function of a second doping type, and wherein the second doping type is opposite the first doping type. In some embodiments, the first doping type is n-type and the second doping type is p-type. In some embodiments, the first doping type is p-type and the second doping type is n-type. In some embodiments, the work function of the metal exceeds about 5.0 electron volts. In some embodiments, the metal includes ruthenium, palladium, platinum, cobalt, nickel, titanium aluminum nitride, tungsten carbon nitride, or any combination of the foregoing. In some embodiments, the select gate electrode includes a second metal with a work function of the first doping type. In some embodiments, the second metal includes hafnium, zirconium, titanium, tantalum, aluminum, or any combination of the foregoing. In some embodiments, the memory cell further includes a control gate dielectric layer cupping an underside of the control gate electrode, wherein the control gate dielectric layer overlies the charge trapping layer, and wherein the control gate dielectric layer lines sidewalls of the control gate electrode and a bottom surface of the control gate electrode. In some embodiments, the select gate electrode includes polysilicon. In some embodiments, the memory cell further includes a high κ control gate dielectric layer and a high κ select gate dielectric layer, wherein the first doping type is n-type, wherein the second doping type is p-type, wherein the high κ control gate dielectric layer underlies the control gate electrode, between the charge trapping layer and the control gate electrode, wherein the high κ select gate dielectric layer underlies the select gate electrode, and wherein the select gate electrode includes a metal with a work function of the first doping type.

In some embodiments, the present application provides a method for manufacturing an IC, the method including: forming a charge trapping layer on a semiconductor substrate; forming a sacrificial gate layer covering the charge trapping layer; patterning the sacrificial gate layer to form a sacrificial control gate overlying the charge trapping layer, and to further form a sacrificial select gate neighboring the charge trapping layer and the sacrificial control gate; forming a common source/drain in the semiconductor substrate, between the sacrificial control and select gates, wherein the common source/drain has a first doping type; and replacing the sacrificial control gate with a control gate electrode, wherein the control gate electrode includes a metal with a work function of a second doping type, and wherein the second doping type is opposite the first doping type. In some embodiments, the first doping type is n-type, wherein the second doping type is p-type. In some embodiments, the method further includes: depositing a high κ dielectric layer covering the charge trapping layer, wherein the sacrificial gate layer is formed over the high κ dielectric layer; and patterning the high κ dielectric layer to form a high κ control gate dielectric layer underlying the sacrificial control gate, and to further form a high κ select gate dielectric layer underlying the sacrificial select gate. In some embodiments, the replacing replaces the sacrificial control gate with the control gate electrode and a high κ control gate dielectric layer, wherein the high κ control gate dielectric layer cups an underside of the control gate electrode. In some embodiments, the method further includes replacing the sacrificial select gate with a select gate electrode, wherein the select gate electrode includes a metal with a work function of the first doping type, wherein the work function of the first doping type is between about 3.5-4.4 electron volts, and wherein the work function of the second doping type is between about 4.8-5.2 electron volts. In some embodiments, the semiconductor substrate includes a memory semiconductor region and a peripheral semiconductor region, wherein the sacrificial control and select gates are formed on the memory semiconductor region, and wherein the method further includes: forming a gate dielectric layer covering the memory semiconductor region and the peripheral semiconductor region; removing the gate dielectric layer from the peripheral semiconductor region, but not the memory semiconductor region, wherein the sacrificial gate layer is formed after the removing and is formed covering the peripheral and memory semiconductor regions over the gate dielectric layer, and wherein the patterning further forms a sacrificial gate on the peripheral semiconductor region; and replacing the sacrificial gate with a gate electrode, wherein the gate electrode has a metal with a work function of the first or second doping type. In some embodiments, the semiconductor substrate includes a memory semiconductor region and a peripheral semiconductor region, wherein the sacrificial control and select gates are formed on the memory semiconductor region, and wherein the method further includes: forming a gate dielectric layer covering the memory semiconductor region and the peripheral semiconductor region, wherein the sacrificial gate layer is formed covering the peripheral and memory semiconductor regions over the gate dielectric layer, and wherein the patterning further forms a sacrificial gate on the peripheral semiconductor region; and replacing the sacrificial gate with a gate electrode, wherein the gate electrode includes a metal with a work function of the first or second doping type, and wherein the replacing removes the gate dielectric layer from the peripheral semiconductor region.

In some embodiments, the present application provides another IC including: a semiconductor substrate; and a memory cell including a pair of source/drain regions in the semiconductor substrate, and further including a control gate electrode, a data storage layer, and a control gate dielectric layer stacked over the semiconductor substrate and between the source/drain regions, wherein the source/drain regions have a first doping type, wherein the control gate dielectric layer is between the data storage layer and the control gate electrode, wherein the control gate electrode has opposite sidewalls lined by the control gate dielectric layer, wherein the control gate electrode includes a metal with a work function of a second doping type, and wherein the second doping type is opposite the first doping type. In some embodiments, the first doping type is n type, wherein the work function of the metal exceeds about 5.0 electron volts. In some embodiments, the semiconductor substrate includes a peripheral semiconductor region and a memory semiconductor region, wherein the memory cell is on the memory semiconductor region, and wherein the IC further includes a semiconductor device on the peripheral semiconductor region, wherein the semiconductor device includes a metal gate electrode and a gate dielectric layer, and wherein the metal gate electrode overlies the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated circuit (IC), the method comprising:
   forming a charge trapping layer on a semiconductor substrate;
   forming a sacrificial gate layer covering the charge trapping layer;
   patterning the sacrificial gate layer to form a sacrificial control gate overlying the charge trapping layer, and to further form a sacrificial select gate neighboring the charge trapping layer and the sacrificial control gate;
   forming a common source/drain in the semiconductor substrate, between the sacrificial control and select gates, wherein the common source/drain has a first doping type; and
   replacing the sacrificial control gate with a control gate electrode, wherein the replacing of the sacrificial control gate is performed independent of the sacrificial select gate, wherein the control gate electrode comprises a first metal, wherein a work function of the first metal is within about 0.4 electron volts of a work function of doped polysilicon having a second doping type, and wherein the second doping type is opposite the first doping type.

2. The method according to claim 1, wherein the sacrificial select gate persists into a final state of the IC and comprises doped polysilicon having the first doping type.

3. The method according to claim 1, further comprising:
   depositing a high k dielectric layer covering the charge trapping layer, wherein the sacrificial gate layer is formed over the high k dielectric layer; and
   patterning the high k dielectric layer to form a high k control gate dielectric layer underlying the sacrificial control gate, and to further form a high k select gate dielectric layer underlying the sacrificial select gate.

4. The method according to claim 1, wherein the replacing replaces the sacrificial control gate with the control gate electrode and a high κ control gate dielectric layer, and wherein the high k control gate dielectric layer cups an underside of the control gate electrode.

5. The method according to claim 1, further comprising:
   replacing the sacrificial select gate with a select gate electrode comprising a second metal, wherein a work function of the second metal is within about 0.4 electron volts of a work function of doped polysilicon having the first doping type.

6. The method according to claim 1, wherein the method further comprises:
   forming a gate dielectric layer covering the semiconductor substrate and the charge trapping layer, wherein the sacrificial gate layer is formed covering the gate dielectric layer, and wherein the patterning further forms a sacrificial gate that is laterally offset from the sacrificial control and select gates and that overlies a first portion of the gate dielectric layer; and
   replacing the sacrificial gate with a gate electrode that is metal, wherein the replacing of the sacrificial gate with the gate electrode removes the first portion of the gate dielectric layer.

7. The method according to claim 6, wherein the patterning forms the sacrificial select gate overlying a second portion of the gate dielectric layer, and wherein the method further comprises:
   replacing the sacrificial select gate with a select gate electrode simultaneously while the sacrificial gate is replaced with the gate electrode, wherein the second portion of the gate dielectric layer persists after the replacing of the sacrificial select gate with the select gate electrode.

8. A method comprising:
   depositing an oxide-nitride-oxide (ONO) layer covering a control-gate region of a substrate and a select-gate region of the substrate;
   performing a first selective etch into the ONO layer to remove the ONO layer from the select-gate region;
   depositing a polysilicon gate layer covering the control-gate region and the select-gate region over the ONO layer;
   performing a second selective etch into the polysilicon gate layer to form a polysilicon control gate and a polysilicon select gate respectively overlying the control-gate region and the select-gate region, wherein the polysilicon control gate further overlies the ONO layer;
   forming a source/drain region in the substrate, between and neighboring the polysilicon control and select gates; and
   replacing the polysilicon control gate and the polysilicon select gate respectively with a metal control gate and a metal select gate, wherein the metal control and select gates have different work functions.

9. The method according to claim 8, wherein the source/drain region is p-type, and wherein a work function of the metal control gate is less than a work function of the metal select gate.

10. The method according to claim 8, wherein the source/drain region is n-type, and wherein a work function of the metal control gate is greater than a work function of the metal select gate.

11. The method according to claim 8, wherein the replacing comprises:
    depositing an interlayer dielectric (ILD) layer covering the substrate and the polysilicon control and select gates;
    performing a planarization into the ILD layer until the polysilicon control and select gates are exposed;
    performing a first selective etch into the polysilicon select gate to remove the polysilicon select gate and to form a first opening in place of the polysilicon select gate;
    forming the metal select gate in the first opening;
    performing a second selective etch into the polysilicon control gate independent of the first selective etch, wherein the second selective etch removes the polysilicon control gate and forms a second opening in place of the polysilicon control gate; and
    forming the metal control gate in the second opening independent of the forming of the metal select gate.

12. The method according to claim 8, wherein the second selective etch further forms a first peripheral polysilicon gate having a bottom surface at a different elevation above the substrate than a bottom surface of the polysilicon control gate and a bottom surface of the polysilicon select gate, and wherein the method further comprises:
    replacing the first peripheral polysilicon gate with a first peripheral metal gate while simultaneously replacing the polysilicon control gate with the metal control gate, wherein the polysilicon select gate is replaced with the metal select gate before or after replacing the polysilicon control gate with the metal control gate.

13. The method according to claim 12, wherein second selective etch further forms a second peripheral polysilicon gate having a bottom surface at a different elevation above the substrate than the bottom surface of the polysilicon control gate, the bottom surface of the polysilicon select gate, and a bottom surface of the first peripheral polysilicon gate, and wherein the method further comprises:

replacing the second peripheral polysilicon gate with a second peripheral metal gate while simultaneously replacing the polysilicon select gate with the metal select gate.

14. A method comprising:

depositing a charge trapping layer overlying a first region of a substrate and further overlying a second region of the substrate that neighbors the first region;

patterning the charge trapping layer to remove the charge trapping layer from the second region of the substrate;

forming a sacrificial layer covering the first and second regions of the substrate over the charge trapping layer;

patterning the sacrificial layer to form a first sacrificial gate overlying the first region of the substrate and the charge trapping layer and to further form a second sacrificial gate overlying the second region of the substrate;

replacing the first sacrificial gate with a first metal gate; and replacing the second sacrificial gate with a second metal gate independent of the replacing of the first sacrificial gate, wherein second metal gate comprises a different material than the first metal gate, and wherein the charge trapping layer and the first and second metal gates define a memory cell.

15. The method according to claim 14, wherein the first metal gate comprises ruthenium, palladium, platinum, cobalt, nickel, titanium aluminum nitride, or tungsten carbon nitride, and wherein the second metal gate comprises hafnium, zirconium, titanium, tantalum, or aluminum.

16. The method according to claim 15, further comprising:

forming a source/drain region in the substrate, adjacent to the first or second metal gate, wherein the source/drain region is n type.

17. The method according to claim 14, wherein the first metal gate comprises hafnium, zirconium, titanium, tantalum, or aluminum, and wherein the second metal gate comprises ruthenium, palladium, platinum, cobalt, nickel, titanium aluminum nitride, or tungsten carbon nitride.

18. The method according to claim 17, further comprising:

forming a source/drain region in the substrate, adjacent to the first or second metal gate, wherein the source/drain region is p type.

19. The method according to claim 14, wherein the first metal gate has a work function less than about 4.4 electron volts, and the second metal gate has a work function greater than about 4.8 electron volts, or vice versa.

20. The method according to claim 14, further comprising:

forming a pair of individual source/drain regions in the substrate, wherein the individual source/drain regions respectively border the first and second sacrificial gates, and wherein the first and second sacrificial gates are laterally between the individual source/drain regions; and forming a common source/drain region in the substrate, wherein the common source/drain region is laterally between and borders the first and second sacrificial gates;

wherein the individual source/drain regions and the common source/drain region share a first doping type, and wherein the first metal gate has a work function that is about the same as doped polysilicon with a second doping type opposite the first doping type.

* * * * *